US012804890B2

(12) United States Patent
Kim et al.

(10) Patent No.: US 12,804,890 B2
(45) Date of Patent: Nov. 17, 2026

(54) SEMICONDUCTOR DEVICES

(71) Applicant: SAMSUNG ELECTRONICS CO., LTD., Suwon-si (KR)

(72) Inventors: Junsoo Kim, Suwon-si (KR); Sungho Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 415 days.

(21) Appl. No.: 18/511,000

(22) Filed: Nov. 16, 2023

(65) Prior Publication Data

US 2024/0268103 A1 Aug. 8, 2024

(30) Foreign Application Priority Data

Feb. 7, 2023 (KR) ........................ 10-2023-0016051

(51) Int. Cl.
*H10B 12/00* (2023.01)

(52) U.S. Cl.
CPC ......... *H10B 12/485* (2023.02); *H10B 12/315* (2023.02); *H10B 12/482* (2023.02)

(58) Field of Classification Search
CPC .. H10B 12/485; H10B 12/315; H10B 12/482; H10B 12/053; H10B 12/033; H10B 12/34; H10D 64/513
See application file for complete search history.

(56) References Cited

U.S. PATENT DOCUMENTS 5,693,971 A 12/1997 Gonzalez
8,648,402 B2 2/2014 Han et al.
8,835,259 B2 9/2014 Jang
9,673,276 B2 6/2017 Kim et al.
10,103,152 B2 10/2018 Kim et al.
10,991,699 B2 4/2021 Kim et al.
2016/0172488 A1 6/2016 Oh et al.
2016/0315088 A1 10/2016 Kang et al.
2017/0029664 A1 * 2/2017 Park ......................... C09G 1/02
(Continued)

FOREIGN PATENT DOCUMENTS

JP 2012-234865 A 11/2012
TW 202236684 9/2022

OTHER PUBLICATIONS

Office Action in Taiwanese Appln. No. 112144844, mailed on Aug. 7, 2024, 9 pages (with English translation).

*Primary Examiner* — Jacob Y Choi
*Assistant Examiner* — Ashley Nicole Blackwell
(74) *Attorney, Agent, or Firm* — Fish & Richardson P.C.

(57) ABSTRACT

A semiconductor device includes a first active pattern protruding from a substrate and extending in a first direction parallel to an upper surface of the substrate; first and second recesses crossing the first active pattern in a second direction perpendicular to the first direction; a first gate structure in the first recess, and including a first gate oxide layer, a first gate pattern and a first capping pattern; a second gate structure in the second recess, and including a second gate oxide layer, a second gate pattern and a second capping pattern; a first metal liner pattern surrounding a portion of a sidewall of the first active pattern, and directly contacting a sidewall of the first gate pattern; and a second metal liner pattern surrounding a portion of the sidewall of the first active pattern, and directly contacting a sidewall of the second gate pattern.

13 Claims, 39 Drawing Sheets

(56) References Cited

U.S. PATENT DOCUMENTS

| | | | | |
|---|---|---|---|---|
| 2017/0047421 | A1 | 2/2017 | Oh et al. | |
| 2017/0069735 | A1* | 3/2017 | Oh | H10D 30/025 |
| 2021/0091085 | A1* | 3/2021 | Yoon | H10B 12/34 |
| 2022/0285527 | A1 | 9/2022 | Wei et al. | |

* cited by examiner

SEMICONDUCTOR DEVICES

CROSS-REFERENCE TO RELATED APPLICATION

This application claims priority under 35 USC § 119 to Korean Patent Application No. 10-2023-0016051, filed on Feb. 7, 2023, in the Korean Intellectual Property Office (KIPO), the contents of which are incorporated by reference herein in their entirety.

BACKGROUND

1. Field

Example embodiments relate to semiconductor devices. Particularly, example embodiments relate to a semiconductor device including a transistor.

2. Description of the Related Art

In a dynamic random access memory (DRAM) device, unit memory cell may include a transistor and a capacitor. Electrical characteristics of the DRAM device may vary depending on characteristics of the transistor in the memory cell.

SUMMARY

According to example embodiments, there is provided a semiconductor device. The semiconductor device may include a first active pattern protruding from a substrate, the first active pattern having an isolated shape, and the first active pattern having a first direction parallel to an upper surface of the substrate as a longitudinal direction; a first recess and a second recess on the first active pattern, each of the first and second recesses extending in a second direction parallel to the upper surface of the substrate and perpendicular to the first direction and crossing the first active pattern, and the first and second recesses being spaced apart from each other in the first direction; a first gate structure disposed in the first recess, and the first gate structure including a first gate oxide layer, a first gate pattern and a first capping pattern; a second gate structure disposed in the second recess, and the second gate structure including a second gate oxide layer, a second gate pattern and a second capping pattern; a first metal liner pattern surrounding a portion of the sidewall of the first active pattern and being spaced apart from the sidewall of the first active pattern, and the first metal liner pattern directly contacting a sidewall of the first gate pattern; and a second metal liner pattern surrounding a portion of the sidewall of the first active pattern and being spaced apart from the sidewall of the first active pattern, and the second metal liner pattern directly contacting a sidewall of the second gate pattern.

According to example embodiments, there is provided a semiconductor device. The semiconductor device may include a first active pattern protruding from a substrate, the first active pattern having an isolated shape and having a first direction parallel to an upper surface of the substrate as a longitudinal direction, and a plurality of first active patterns arranged in a second direction parallel to the upper surface of the substrate and perpendicular to the first direction, and the first active patterns being spaced apart from each other; a first recess and a second recess on each of the first active patterns, each of the first and second recesses extending in the second direction and crossing the first active patterns arranged in the second direction, and the first and second recesses being spaced apart from each other in the first direction; a first gate structure disposed in the first recess, and the first gate structure including a first gate pattern extending in the second direction; a second gate structure disposed in the second recess, and the second gate structure including a second gate pattern extending in the second direction; a first structure surrounding a sidewall of a first portion of first active pattern disposed outside of the first gate structure, and the first structure in which a first insulation layer pattern and a first metal liner pattern are laterally stacked from the sidewall of the first portion of the first active pattern; and a second structure surrounding a sidewall of a second portion of first active pattern disposed outside of the second gate structure, and the second structure in which a second insulation layer pattern and a second metal liner pattern are laterally stacked from the sidewall of the second portion of the first active pattern. Both ends of the first metal liner pattern may contact a sidewall of the first gate pattern. Both ends of the second metal liner pattern may contact a sidewall of the second gate pattern.

According to example embodiments, there is provided a vertical semiconductor device. The vertical semiconductor device may include a first active pattern protruding from a substrate, the first active pattern having an isolated shape, and the first active pattern having a first direction parallel to an upper surface of the substrate as a longitudinal direction; a first gate structure and a second gate structure on the first active pattern, each of the first and second recesses extending in a second direction parallel to the upper surface of the substrate and perpendicular to the first direction and crossing the first active pattern, and the first and second gate structures being spaced apart from each other in the first direction; a first metal liner pattern surrounding a portion of the sidewall of the first active pattern and being spaced apart from the sidewall of the first active pattern, and the first metal liner pattern having an upper surface lower than an upper surface of the first gate structure; a second metal liner pattern surrounding a portion of the sidewall of the first active pattern and being spaced apart from the sidewall of the first active pattern, and the second metal liner pattern having an upper surface lower than an upper surface of the second gate structure; a bit line structure electrically connected to an upper portion of the first active pattern between the first and second gate structures; contact plugs contacting an upper portion of the first active pattern disposed outside the first gate structure and an upper portion of the first active pattern disposed outside the second gate structure, respectively; and a capacitor electrically connected to each of the contact plugs.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, preferred embodiments will be described in detail with reference to the accompanying drawings. Hereinafter, a first direction and a second direction may be parallel to an upper surface of a substrate, and may be perpendicular to each other.

Figure 1:
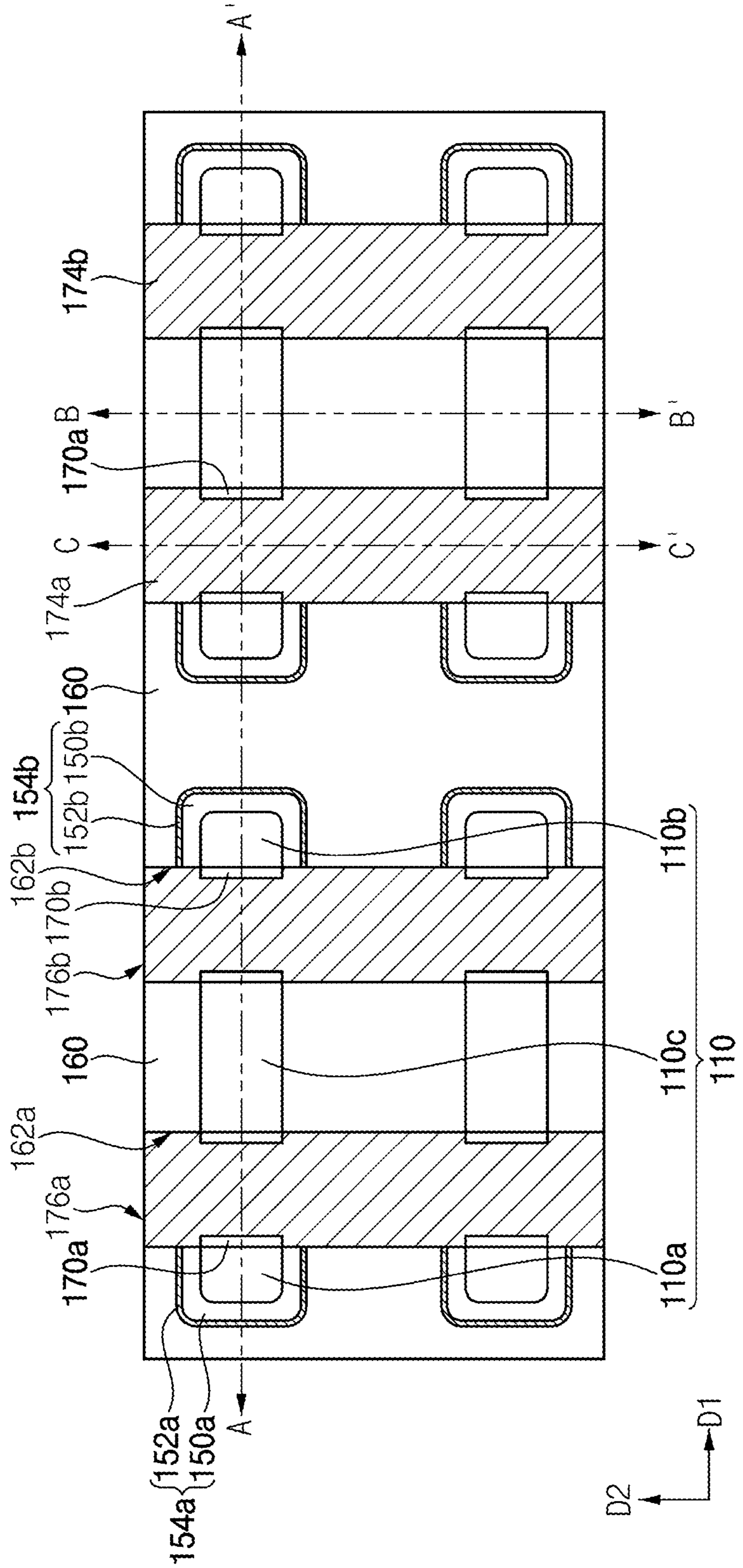
FIGS. 1 to 3 are a plan view and cross-sectional views illustrating a semiconductor device according to example embodiments.
Figure 2:
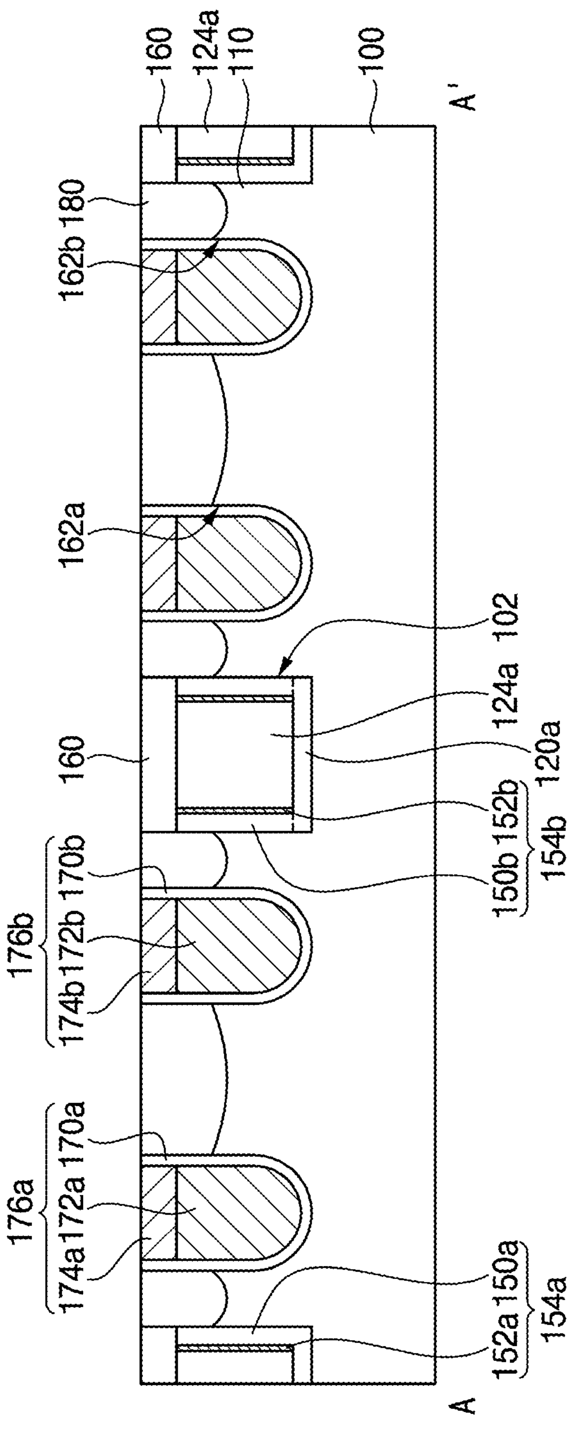
Figure 3:
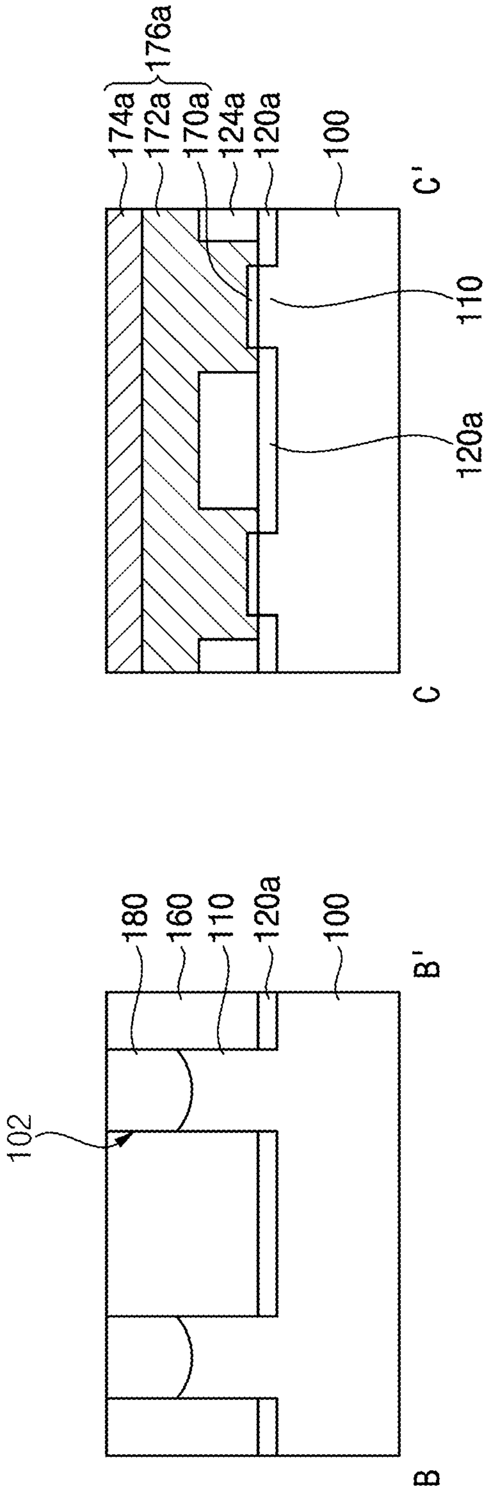
Figure 4:
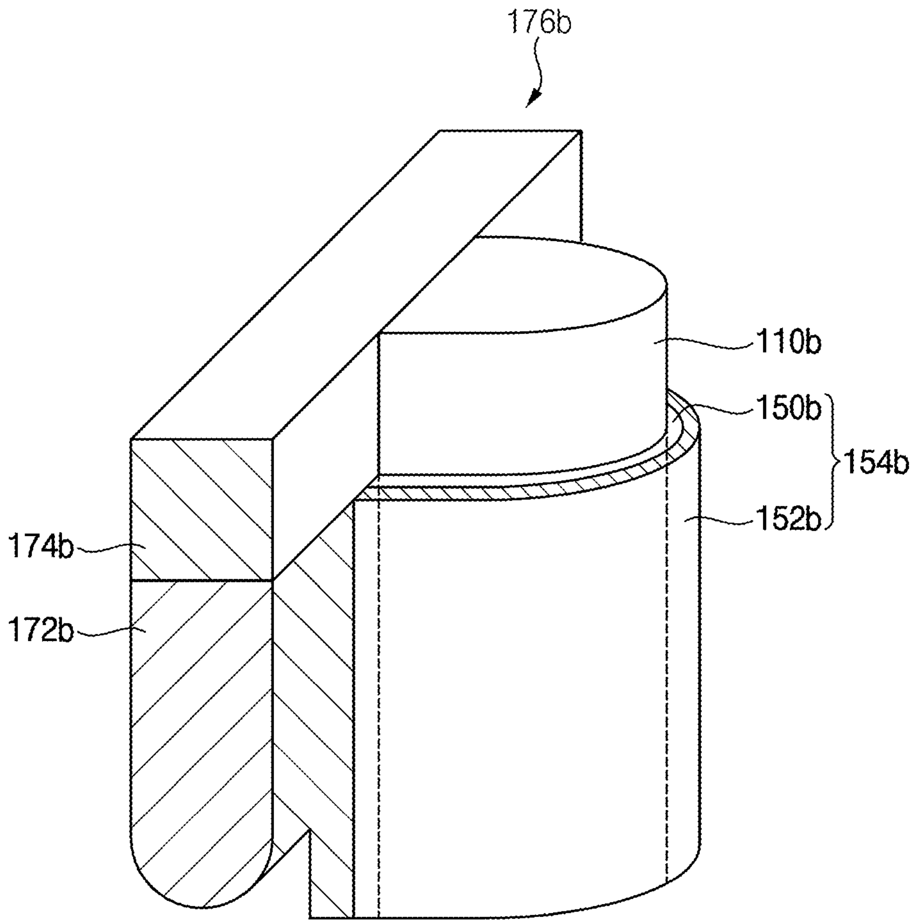
FIG. 4 is a perspective view of a portion of the semiconductor device according to example embodiments.

FIG. 1 is a plan view illustrating a semiconductor device according to example embodiments. FIG. 2 illustrates a cross-sectional view along line A-A' of FIG. 1, FIG. 3 illustrates cross-sectional views along line B-B' and line C-C' of FIG. 1, and FIG. 4 is a perspective view of a portion of a second liner structure and a first active pattern in the semiconductor device of FIG. 1.

Referring to FIGS. 1 to 4, a substrate 100 may be provided. The substrate 100 may include a semiconductor material, e.g., silicon, germanium, or silicon-germanium, or a III-V compound semiconductor, e.g., GaP, GaAs, or GaSb. In some example embodiments, the substrate 100 may be a silicon-on-insulator (SOI) substrate or a germanium-on-insulator (GOI) substrate.

An isolation trench 102 may be disposed at an upper portion of the substrate 100. A first active pattern 110 may be defined as a portion of the substrate 100 between portions of the isolation trench 102. For example, referring to FIG. 1, the isolation trench 102 may extend continuously in a grid pattern in the first and second directions D1 and D2, and a plurality of the first active patterns 110 may be arranged in a matrix pattern between portions of the first trench 104, e.g., so each of the first active patterns 110 may be surrounded by portions of the isolation trench 102 (e.g., as viewed in a top view). The first active pattern 110 may protrude from the substrate 100 above a bottom of the isolation trench 102.

The first active patterns 110 may have an isolated shape (e.g., completely surrounded by the isolation trench 102) having the first direction D1 as a longitudinal direction (i.e., length direction). In example embodiments, a plurality of first active patterns 110 may be regularly arranged in the first and second directions D1 and D2, and the first active patterns 110 may be spaced apart from each other. The first active patterns 110 may be disposed parallel to each other in the first direction D1. Also, the first active patterns 110 may be disposed parallel to each other in the second direction D2.

First and second recesses 162*a* and 162*b* may be positioned in regions of the substrate 100 where first and second gate structures are to be formed. The first and second recesses 162*a* and 162*b* may be formed on the first active pattern 110 and the isolation trench 102. Two gate structures (i.e., the first and second gate structures) may be disposed on each of the first active patterns 110, and thus, the first and second recesses 162*a* and 162*b* spaced apart from each other in the first direction D1 may be formed on each of the first active patterns 110. The first and second recesses 162*a* and 162*b* may extend, e.g., lengthwise, in the second direction D2. Each of the first and second recesses 162*a* and 162*b* may extend to cross the first active patterns 110 arranged, e.g., spaced apart, in the second direction D2.

The upper portion of the first active pattern 110 may be divided into a first portion 110*a*, a second portion 110*b*, and a third portion 110*c* by the first and second recesses 162*a* and 162*b*. The first portion 110*a* may be a portion disposed outside the first recess 162*a*, the second portion 110*b* may be a portion disposed outside the second recess 162*b*, and the third portion 110*c* may be a portion between the first and second recesses 162*a* and 162. For example, the first portion may correspond to a left outside of the first recess 162*a*, and the second portion 110*b* may correspond to a right outside of the second recess 162*b*. For example, as illustrated in FIG. 1, the first recess 162*a* may be between the first and third portions 110*a* and 110*c*, and the second recess 162*b* may be between the second and third portions 110*b* and 110*c*. Sidewalls and bottoms of the first and second recesses 162*a* and 162*b* may expose the first active pattern 110.

The first and second recesses 162*a* and 162*b* in the isolation trench 102 between the first active patterns 110 in the second direction D2 may expose an insulation layer pattern. The insulation layer pattern may include, e.g., silicon oxide. As shown in the cross-sectional view on the right side of FIG. 3, a first insulation layer pattern 120*a* and a second insulation layer pattern 124*a* including the silicon oxide may be stacked in the first and second recesses 162*a* and 162*b* on the isolation trench 102 between the first active patterns 110 in the second direction D2. In example embodiments, a height of a surface of the second insulation layer pattern 124*a* exposed by bottoms of the first and second recesses 162*a* and 162*b* in the isolation trench 102 may be higher than a surface of the first active pattern 110 exposed by bottoms of the first and second recesses 162*a* and 162*b*, e.g., a height of a top surface of the second insulation layer pattern 124*a* may be higher than a top surface of the first active pattern 110 relative to a bottom of the substrate 100 in each of the first and second recesses 162*a* and 162*b*. Therefore, a bottom of each of the first and second recesses 162*a* and 162*b* may not be flat (e.g., due to the second insulation layer pattern 124*a* and the first active pattern 110 protruding to different heights into each of the first and second recesses 162*a* and 162*b*). In each of the first and second recesses 162*a* and 162*b*, a bottom exposing the first active pattern 110 may be lower than a bottom exposing the second insulation layer pattern 124*a*.

A first gate structure 176*a* may be formed in the first recess 162*a*, and a second gate structure 176*b* may be formed in the second recess 162*b*. The first gate structure 176*a* may include a first gate oxide layer 170*a*, a first gate pattern 172*a*, and a first capping pattern 174*a*.

The first gate oxide layer 170*a* may be formed only on a portion of the surface of the first active pattern 110 exposed by the first recess 162*a*. In example embodiments, the first gate oxide layer 170*a* may include silicon oxide. The first gate oxide layer 170*a* may be silicon oxide formed by an oxidation process.

The first gate pattern 172*a* may be formed, e.g., continuously, in the first recess 162*a* to cover the first gate oxide layer 170*a* and exposed portions of the first insulation layer pattern 120*a* and the second insulation layer pattern 124*a*. The first gate pattern 172*a* may extend, e.g., lengthwise, in the second direction D2, and may include a metal. In example embodiments, the first gate pattern 172*a* may include a metal pattern and a barrier metal pattern surrounding sidewalls and bottom of the metal pattern. The metal pattern may include, e.g., tungsten, aluminum, copper, or the like. In some example embodiments, the first gate pattern 172*a* may include only a metal pattern. In this case, the metal pattern may include, e.g., tungsten.

The first capping pattern 174*a* may be formed on an upper surface of the first gate pattern 172*a*, and may, e.g., completely, fill an upper portion of the first recess 162*a*. The first capping pattern 174*a* may include an insulation material, e.g., silicon nitride.

The second gate structure 176*b* may include a second gate oxide layer 170*b*, a second gate pattern 172*b*, and a second capping pattern 174*b*. The second gate structure 176*b* may be formed by the same process as a process for forming the first gate structure 176*a*. Accordingly, the first and second gate structures 176*a* and 176*b* may have the same stacked structure and the same material. That is, the second gate oxide layer 170*b* may include a same material as the material of the first gate oxide layer 170*a*. The second gate pattern 172*b* may include a same material as the material of the first gate pattern 172*a*, and the second capping pattern 174*b* may include a same material as the material of the first capping pattern 174*a*.

The second gate oxide layer 170*b* may be formed only on a portion of the surface of the first active pattern 110 exposed by the second recess 162*b*. The second gate oxide layer 170*b* may be silicon oxide formed by the oxidation process.

An impurity region 180 may be formed at an upper portion of the first active pattern 110 adjacent to sidewalls of the first and second gate structures 176*a* and 176*b*. The impurity region 180 may serve as a source/drain region of the recessed channel transistor. In example embodiments, as illustrated FIGS. 2 and 4, upper surfaces of the first and second gate structures 176*a* and 176*b* may be substantially coplanar with upper surfaces of the first active pattern 110, e.g., upper surfaces of the first and second capping patterns 174*a* and 174*b* may be substantially coplanar with upper surfaces of the impurity regions 180.

A first liner structure 154*a* may surround a sidewall of the first portion 110*a* of the first active pattern, and a second liner structure 154*b* may surround a sidewall of the second portion 110*b* of the first active pattern.

The first liner structure 154*a* may include a third insulation layer pattern 150*a* and a first metal liner pattern 152*a* laterally stacked from the sidewall of the first portion 110*a* of the first active pattern. The second liner structure 154*b* may include a fourth insulation layer pattern 150*b* and a second metal liner pattern 152*b* laterally stacked from the sidewall of the second portion 110*b* of the first active pattern. The third insulation layer pattern 150*a* may be interposed between the sidewall of the first portion 110*a* of the first active pattern and the first metal liner pattern 152*a*. The fourth insulation layer pattern 150*b* may be interposed between the sidewall of the second portion 110*b* of the first active pattern and the second metal liner pattern 152*b*.

The second liner structure 154*b* may be formed by the same process as a process for forming the first liner structure 154*a*. Accordingly, the second liner structure 154*b* and the first liner structure 154*a* may have the same stacked structure and the same material.

The third and fourth insulation layer patterns 150*a* and 150*b* may include, e.g., silicon oxide. The first and second metal liner patterns 152*a* and 152*b* may include, e.g., titanium, titanium nitride, tantalum, tantalum nitride, tungsten, tungsten nitride, tungsten carbonitride, or the like.

In the plan view, both, e.g., opposite, ends of the first liner structure 154*a* may directly contact the first gate pattern 172*a* of the first gate structure 176*a*. Thus, both, e.g., opposite, ends of the first metal liner pattern 152*a* may contact sidewalls of the first gate pattern 172*a*, so that the first metal liner pattern 152*a* and the first gate pattern 172*a* may be electrically connected to each other.

The first metal liner pattern 152*a* may be spaced apart from the sidewall of the first active pattern 110. The first metal liner pattern 152*a* may surround the sidewall of the first portion 110*a* of the first active pattern, and the third insulation layer pattern 150*a* may be interposed between the first metal liner pattern 152*a* and the first portion 110*a* of the first active pattern. The first gate pattern 172*a* and the first metal liner pattern 152*a* may have a gate all-around (GAA) structure surrounding sidewalls of the first portion 110*a* of the first active pattern. In this case, the third insulation layer pattern 150*a* and the first gate oxide layer 170*a* may be interposed between the first gate pattern 172*a* and the first metal liner pattern 152*a* and the first portion 110*a* of the first active pattern.

Similarly, in the plan view, both ends of the second liner structure 154*b* may directly contact the second gate pattern 172*b* of the second gate structure 176*b*. Thus, both ends of the second metal liner pattern 152*b* may contact sidewalls of the second gate pattern 172*b*, so that the second metal liner pattern 152*b* and the second gate pattern 172*b* may be electrically connected to each other.

Also, the second metal liner pattern 152*b* may be spaced apart from the sidewall of the first active pattern 110. The second metal liner pattern 152*b* may surround the sidewall of the second portion 110*b* of the first active pattern, and the fourth insulation layer pattern 150*b* may be interposed between the second metal liner pattern 152*b* and the second portion 110*b* of the first active pattern. Therefore, the second gate pattern 172*b* and the second metal liner pattern 152*b* may have a gate all-around (GAA) structure surrounding the sidewall of the second portion 110*b* of the first active pattern (FIG. 4). In this case, the fourth insulation layer pattern 150*b* and the second gate oxide layer 170*b* may be interposed between the second gate pattern 172*b* and the second metal liner pattern 152*b* and the second portion 110*b* of the first active pattern.

Since each of the first and second metal liner patterns 152*a* and 152*b* is formed so as to improve a control operation of a gate in the recessed channel transistor, a thickness of each of the first and second metal liner patterns 152*a* and 152*b* may not be limited. However, for a high integration of the recessed channel transistor, the thickness of each of the first and second metal liner patterns 152*a* and 152*b* may be thin. In example embodiments, each of the first and second metal liner patterns 152*a* and 152*b* may have a thickness (e.g., measured in a plane defined by the first and second directions D1 and D2) of about 10 angstroms to about 100 angstroms, e.g., about 20 angstroms to about 30 angstroms.

The first active pattern 110 and the first metal liner pattern 152*a* may be insulated from each other by the third insulation layer pattern 150*a*, and the first active pattern 110 and the second metal liner pattern 152*b* may be insulated from each other by the fourth insulation layer pattern 150*b*. In example embodiments, for the insulation between the active patterns and the metal liner patterns, a thickness of each of the third and fourth insulation layer patterns 150*a* and 150*b* may be greater than the thickness of each of the first and second metal liner patterns 152*a* and 152*b*.

Uppermost surfaces of the first and second metal liner patterns 152*a* and 152*b* may be lower than upper surfaces of the first and second gate structures 176*a* and 176*b*, e.g., relative to the bottom of the substrate 100. The uppermost surfaces of the first and second metal liner patterns 152*a* and 152*b* may be lower than the upper surface of the first active pattern 110, e.g., the uppermost surfaces of the first and second metal liner patterns 152*a* and 152*b* may be lower than the upper surface of the impurity region 180 in the first active pattern 110 relative to the bottom of the substrate 100.

The first and second gate patterns 172*a* and 172*b* may be electrically isolated from each other.

As shown in the cross-sectional view of the left side of FIG. 3, an insulation layer pattern may be formed in the isolation trench 102 between the third portions 110*c* of the first active pattern spaced apart from each other in the second direction D2. The insulation layer pattern may include silicon oxide. For example, the first insulation layer pattern 120*a* and a fifth insulation layer pattern 160 may be formed in the isolation trench 102.

In addition, an insulation layer pattern may be formed in the isolation trench 102 outside the first and second liner structures 154*a* and 154*b*. The insulation layer pattern may include, e.g., silicon oxide. For example, the first insulation layer pattern 120*a*, the second insulation layer pattern 124*a*, and the fifth insulation layer pattern 160 may be formed in the isolation trench 102.

The first gate structure 176*a*, the first liner structure 154*a*, and the impurity region 180 adjacent to both, e.g., opposite, sides of the first gate structure 176*a* may serve as a first recessed channel transistor. The second gate structure 176*b*, the second liner structure 154*b*, and the impurity region 180 adjacent to both, e.g., opposite, sides of the second gate structure 176*b* may serve as a second recessed channel transistor. Accordingly, two recessed channel transistors may be disposed on each of the first active patterns 110.

As described above, the first and second metal liner patterns 152*a* and 152*b* may be included in the two recessed channel transistors disposed on the first active pattern 110, respectively. The first metal liner patterns 152*a* may be electrically connected to the first gate patterns 172*a*, so that the first metal liner patterns 152*a* and the first gate patterns 172*a* may serve as a gate electrode in the first recessed channel transistors. The second metal liner patterns 152*b* may be electrically connected to the second gate patterns 172*b*, so that the second metal liner patterns 152*b* and the second gate patterns 172*b* serve as a gate electrode in the second recessed channel transistors.

As each of the first and second metal liner patterns 152*a* and 152*b* surrounds a portion of the first active pattern 110, a control operation characteristic of a gate in each of the recessed channel transistors may be improved. In addition, as the first and second metal liner patterns 152*a* and 152*b* are formed, a capacitance at each of the first and second gate oxide layers 170*a* and 170*b* may increase. Accordingly, in each of the first and second recessed channel transistors, a short channel effect may be decreased.

FIGS. 5 to 31 are plan views and cross-sectional views illustrating stages in a method of manufacturing a transistor according to example embodiments. FIGS. 5, 8, 11, 14, 17, 20, 23, 26 and 29 are plan views, FIGS. 6, 9, 12, 15, 18, 21, 24, 27 and 30 are cross-sectional views taken along line A-A' of corresponding plant views, and FIGS. 7, 10, and 13 are cross-sectional views taken along line B-B' of corresponding plan views. FIGS. 16, 19, 22, 25, 28 and 31 are cross-sectional views taken along line B-B' and line C-C' of corresponding plan views.

Figure 5:
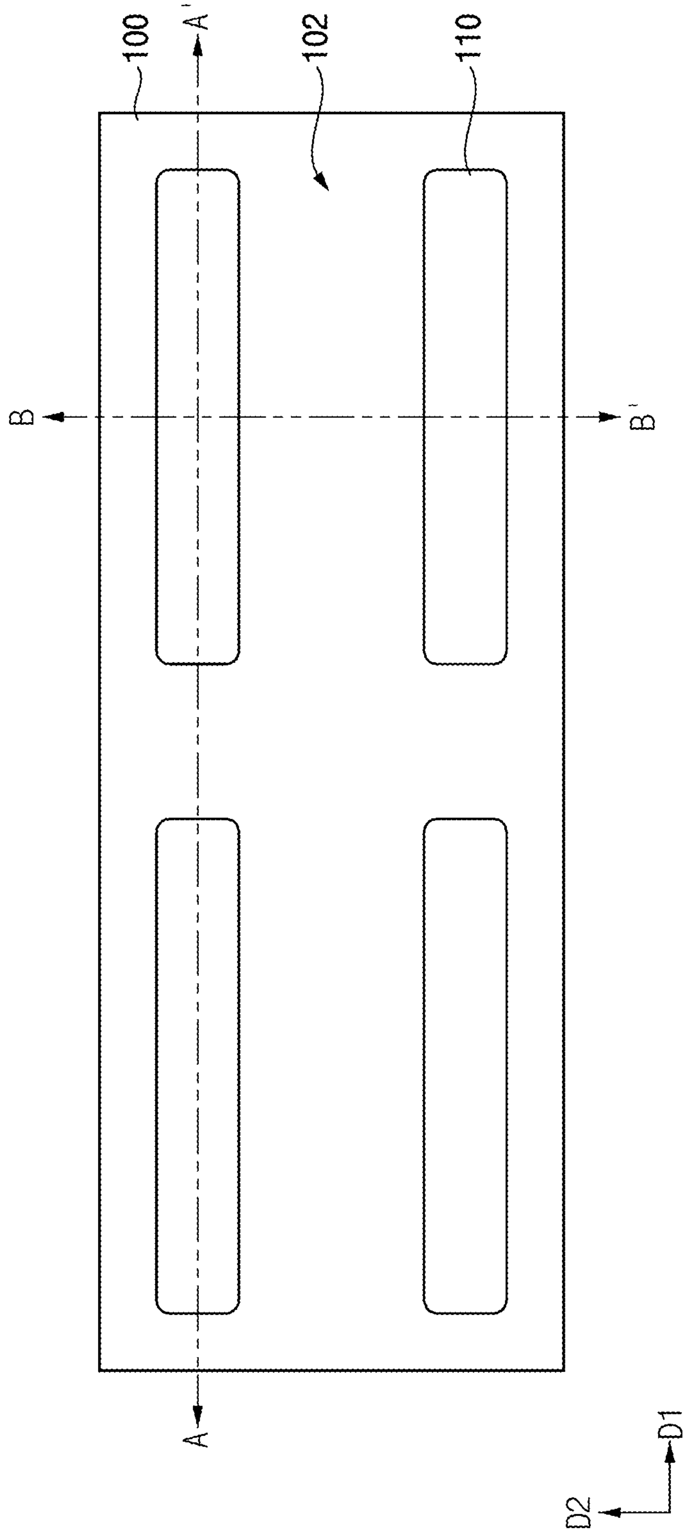
FIGS. 5 to 31 are plan views and cross-sectional views illustrating stages in a method of manufacturing a transistor according to example embodiments.
Figure 6:
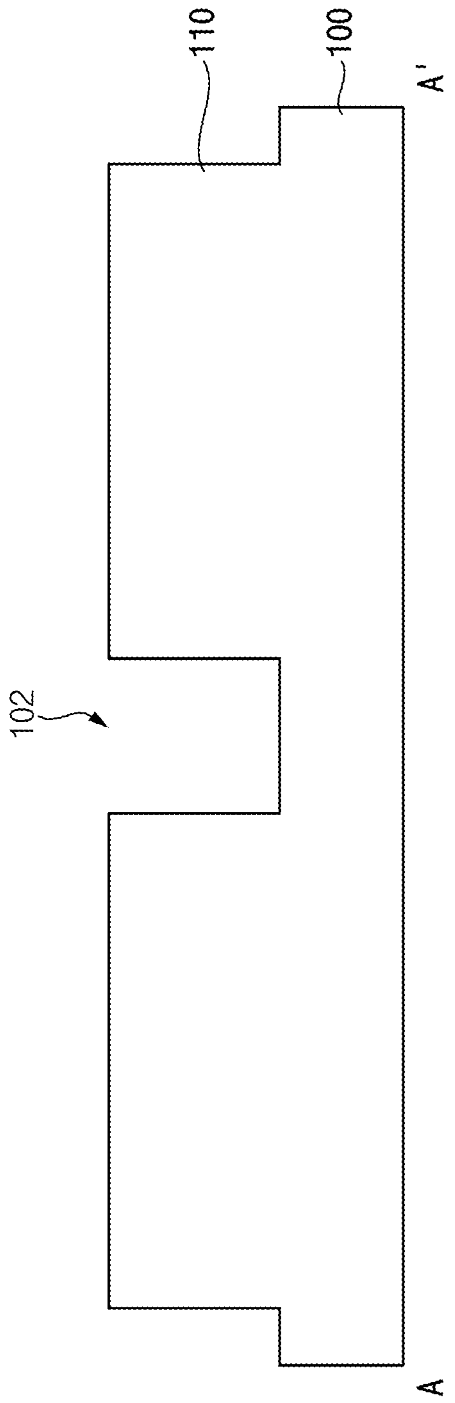
Figure 7:
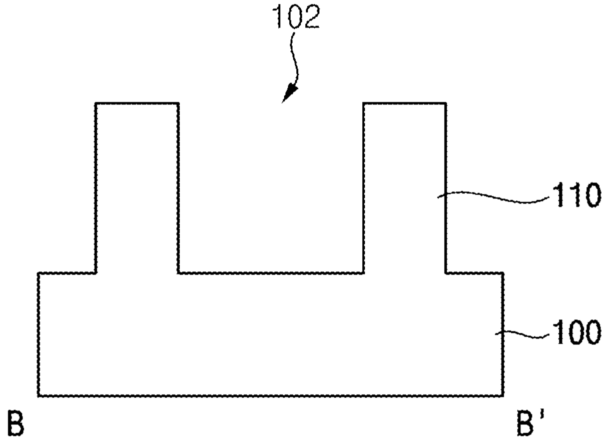

Referring to FIGS. 5 to 7, a portion of the substrate 100 may be etched to form the isolation trench 102 and the first active patterns 110. The first active patterns 110 may be protruding portions between, e.g., surrounded by, portions of the isolation trench 102.

Each of the first active patterns 110 may have an isolated shape having the first direction D1 as a longitudinal direction. The first active patterns 110 may be arranged in each of the first and second directions D1 and D2, and the first active patterns 110 may be spaced apart from each other. The first active patterns 110 may be disposed parallel to each other in the first direction D1, and may be disposed parallel to each other in the second direction D2. As the first active patterns 110 extending in the first direction D1 are arranged in the first and second directions D1 and D2, a patterning process for forming the first active patterns 110 may be easily performed.

Figure 8:
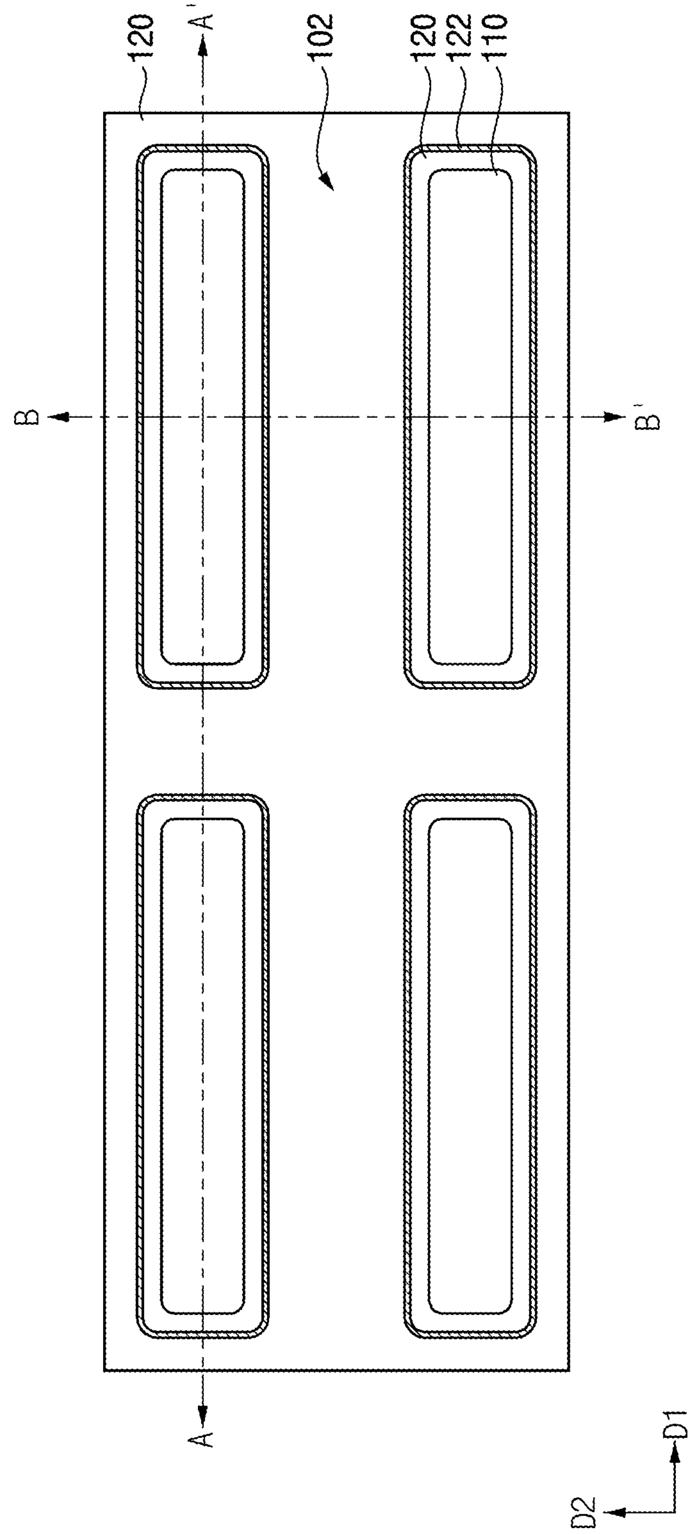
Figure 9:
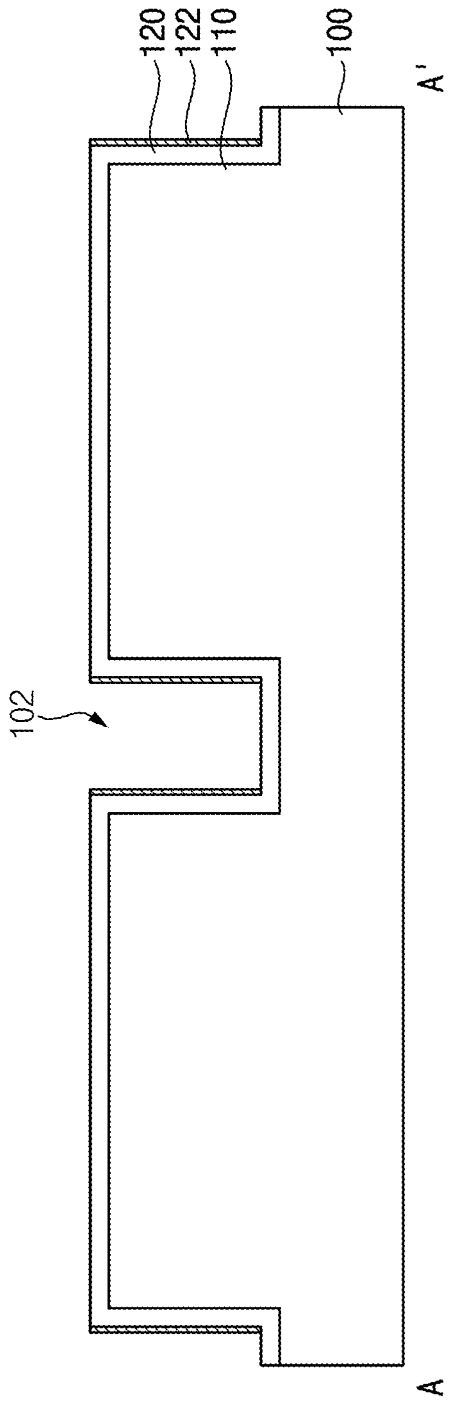
Figure 10:
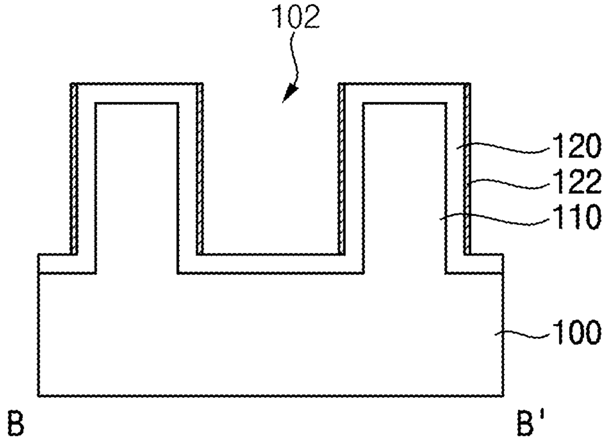

Referring to FIGS. 8 to 10, a first insulation layer 120 may be formed on surfaces of the first active pattern 110 and the isolation trench 102. The first insulation layer 120 may include, e.g., silicon oxide. The first insulation layer 120 may be formed by, e.g., an atomic layer deposition process.

A metal liner layer may be formed on a surface of the first insulation layer 120. The metal liner layer may include, e.g., titanium, titanium nitride, tantalum, tantalum nitride, tungsten, tungsten nitride, tungsten carbonitride, or the like. The metal liner layer may be formed by, e.g., an atomic layer deposition process.

The first insulation layer 120 and the metal liner layer may be conformally formed on the surfaces of the isolation trench 102 and the first active pattern 110. After forming the metal liner layer, an inner space in the isolation trench 102 may remain.

Thereafter, the metal liner layer may be anisotropically etched to form a first preliminary metal liner pattern 122. In the anisotropic etching process, portions of the metal liner layer on an upper surface of the first active pattern 110 and on a bottom of the isolation trench 102 may be removed. Accordingly, the first preliminary metal liner pattern 122 may be formed on the first insulation layer 120 on the sidewall of the isolation trench 102.

Figure 11:
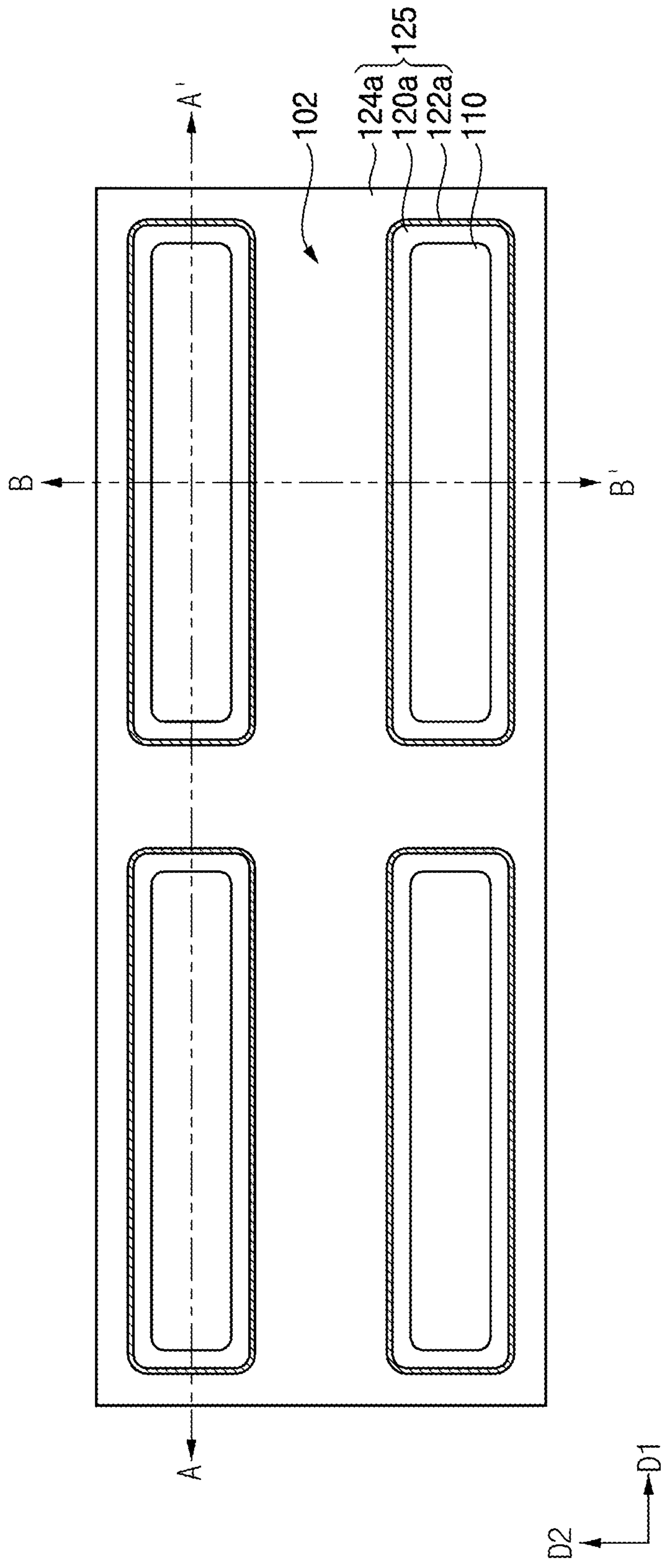
Figure 12:
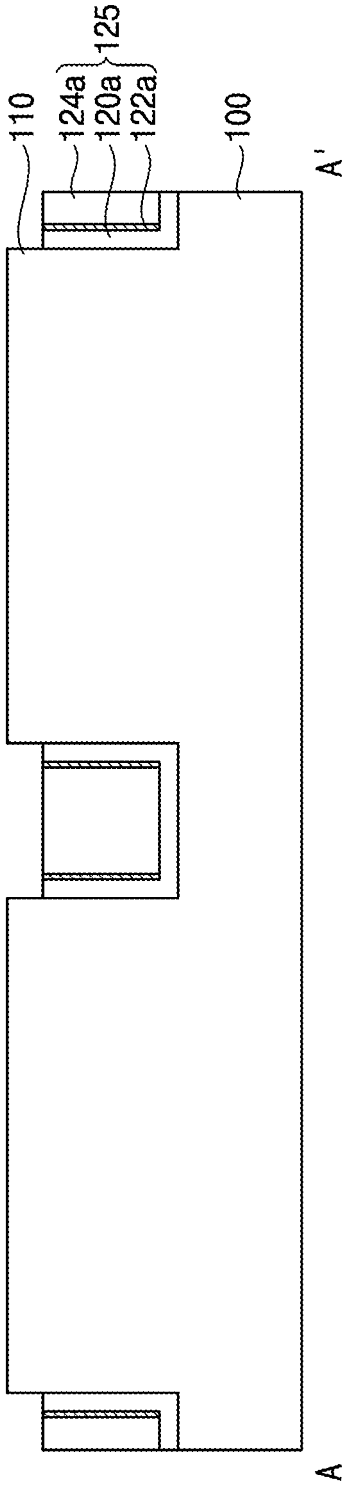
Figure 13:
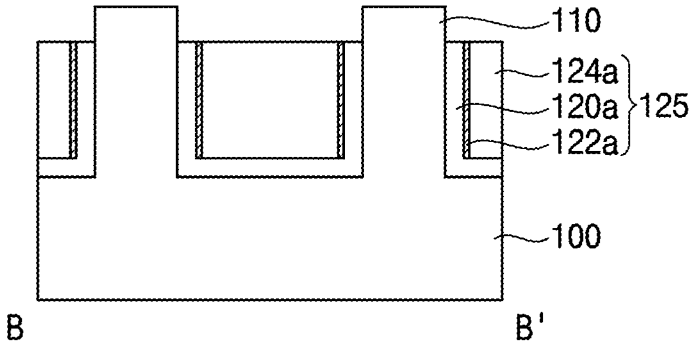

Referring to FIGS. 11 to 13, a second insulation layer may be formed on the first insulation layer 120 and the first preliminary metal liner pattern 122 to completely fill the isolation trench 102. The second insulation layer may include, e.g., silicon oxide.

After that, an upper surface of the second insulation layer may be planarized until the upper surface of the first active pattern 110 may be exposed. The planarization process may include, e.g., a chemical mechanical polishing process. In some example embodiments, the planarization process for the upper surface of the second insulation layer may be omitted.

Upper portions of the first insulation layer 120, the second insulation layer, and the first preliminary metal liner pattern 122 may be partially etched by an etch-back process. Accordingly, the first insulation layer pattern 120*a*, a second preliminary metal liner pattern 122*a*, and the second insulation layer pattern 124*a* may be formed in the isolation trench 102.

An upper surface of a first structure 125 including the first insulation layer pattern 120*a*, the second preliminary metal liner pattern 122*a*, and the second insulation layer pattern 124*a* may be lower than the upper surface of the first active pattern 110. Accordingly, an upper portion of the first active pattern 110 may protrude in the vertical direction from (e.g., above or beyond) the first structure 125, and the upper surface and an upper sidewall of the first active pattern 110 may be exposed (e.g., in a region above the first structure 125). The first insulation layer pattern 120*a* and the second preliminary metal liner pattern 122*a* may surround a sidewall of the first active pattern 110.

Figure 14:
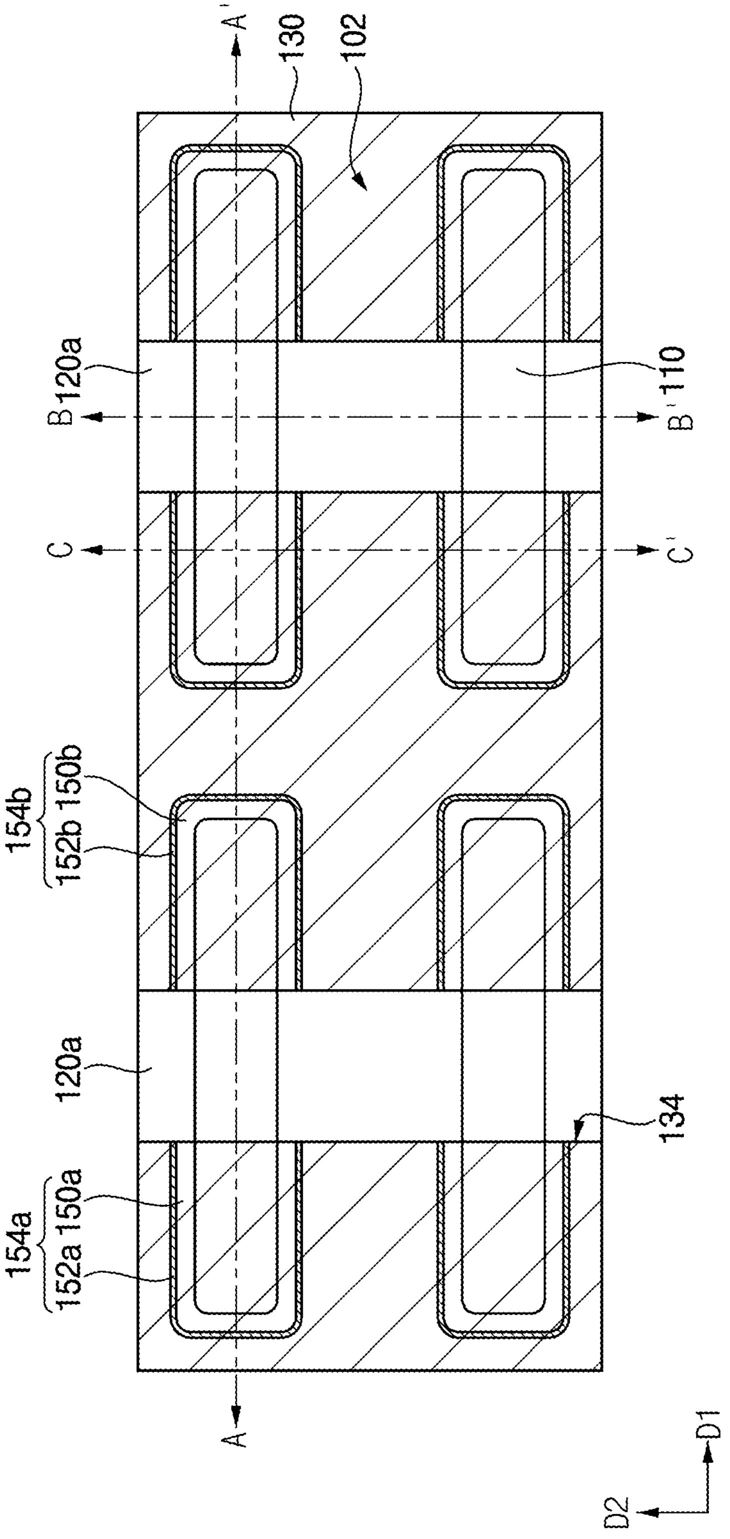
Figure 15:
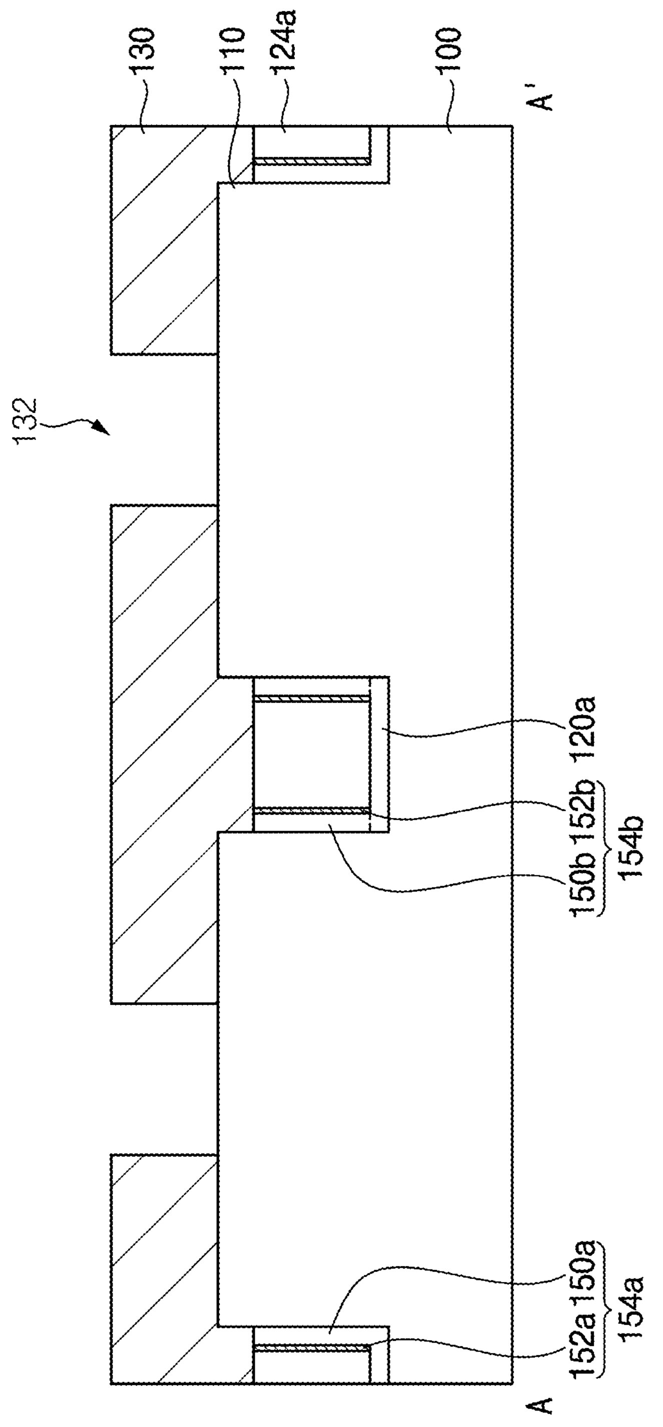
Figure 16:
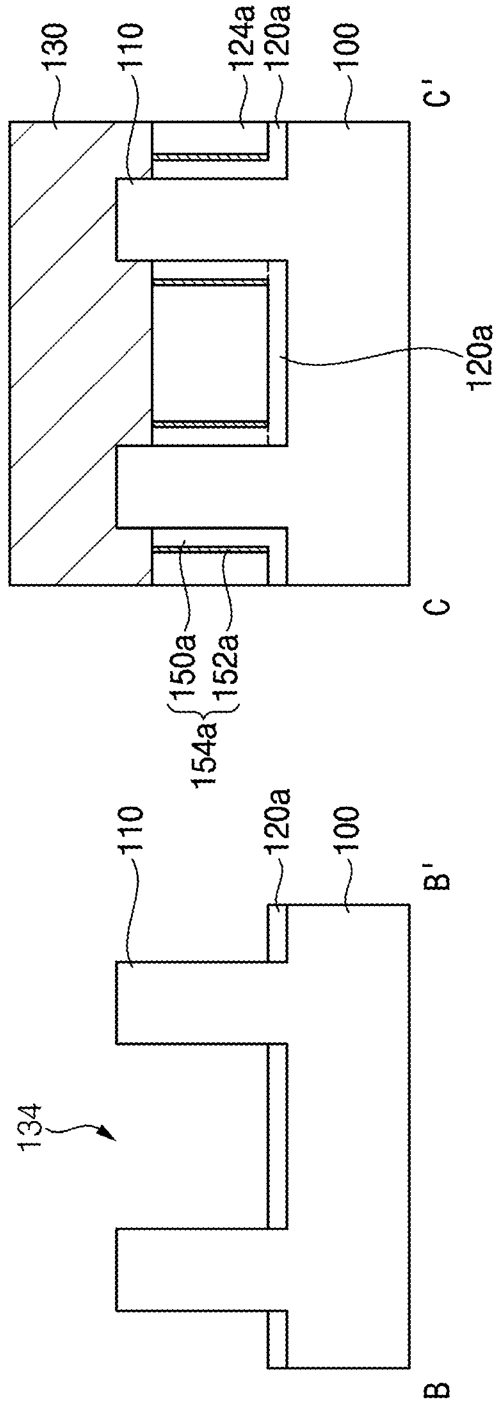

Referring to FIGS. 14 to 16, a first hard mask layer may be formed on the first active pattern 110 and the first structure 125 to cover the first active pattern 110 and the first structure 125. The first hard mask layer may be patterned to form a first hard mask pattern 130.

The first hard mask pattern 130 may include an opening 132 extending in the second direction D2 and positioned on the central portion of the first active pattern 110. The opening 132 may expose at least a portion between two gate structures on the first active pattern 110 subsequently formed.

An exposed portion of the first structure 125 may be etched using the first hard mask pattern 130 as an etch mask to form a first opening 134. The first insulation layer pattern 120*a*, the second preliminary metal liner pattern 122*a*, and the second insulation layer pattern 124*a* may be etched using the first hard mask pattern 130 by the etching process. The second preliminary metal liner pattern 122*a* may be completely separated by the first opening 134 to form the first metal liner pattern 152*a* and the second metal liner pattern 152*b* that are separated from each other and spaced apart from each other in the first direction D1. Hereinafter, the first insulation layer pattern between the sidewall of the first active pattern 110 and the first metal liner pattern 152*a* is referred to as the third insulation layer pattern 150*a*. The first insulation layer pattern between the sidewall of the first active pattern 110 and the second metal liner pattern 152*b* is referred to as the fourth insulation layer pattern 150*b*.

By the etching process, the first liner structure 154*a* in which the third insulation layer pattern 150*a* and the first metal liner pattern 152*a* are stacked may be formed on a portion of the sidewall of the first active pattern 110, and the second liner structure 154*b* in which the fourth insulation layer pattern 150*b* and the second metal liner pattern 152*b* are stacked may be formed on a portion of the sidewall of the first active pattern 110. The first and second liner structures 154*a* and 154*b* may not be formed in the first opening 134.

The first liner structure 154*a* may surround a sidewall of the first active pattern 110 of a left outside of the first opening 134, e.g., the first liner structure 154*a* may surround the sidewall of the first active pattern 110 on a left external side of the first opening 134 (e.g., as seen in FIG. 14). The second liner structure 154*b* may surround a sidewall of the first active pattern 110 of a right outside of the first opening 134, e.g., the second liner structure 154*b* may surround the sidewall of the first active pattern 110 on a right external side of the first opening 134 (e.g., as seen in FIG. 14).

In the etching process, the first active pattern 110 may not be etched. Accordingly, the sidewall and upper surfaces of the first active pattern 110 may be exposed by the first opening 134. The first insulation layer pattern 120*a* may remain on a lowermost surface of the first opening 134.

Figure 17:
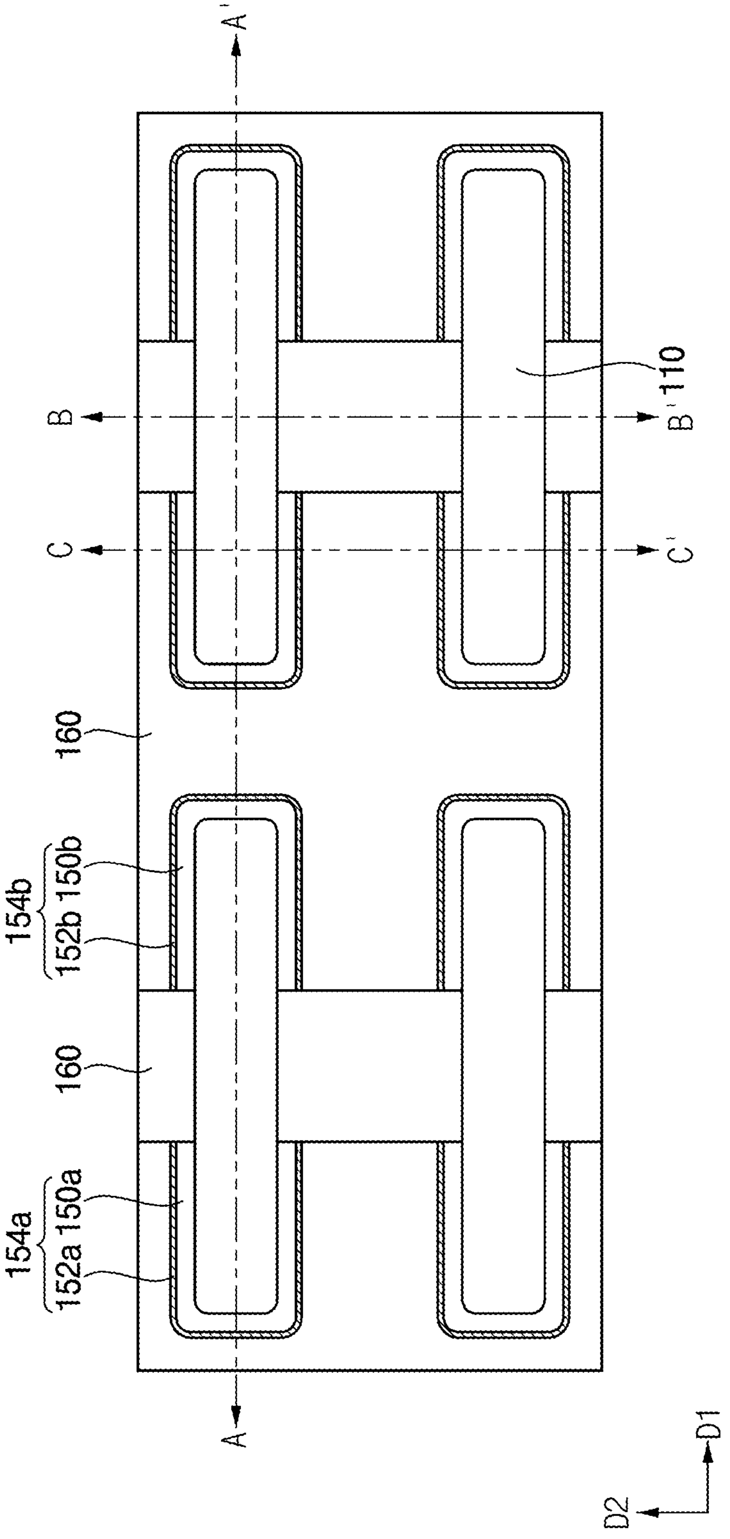
Figure 18:
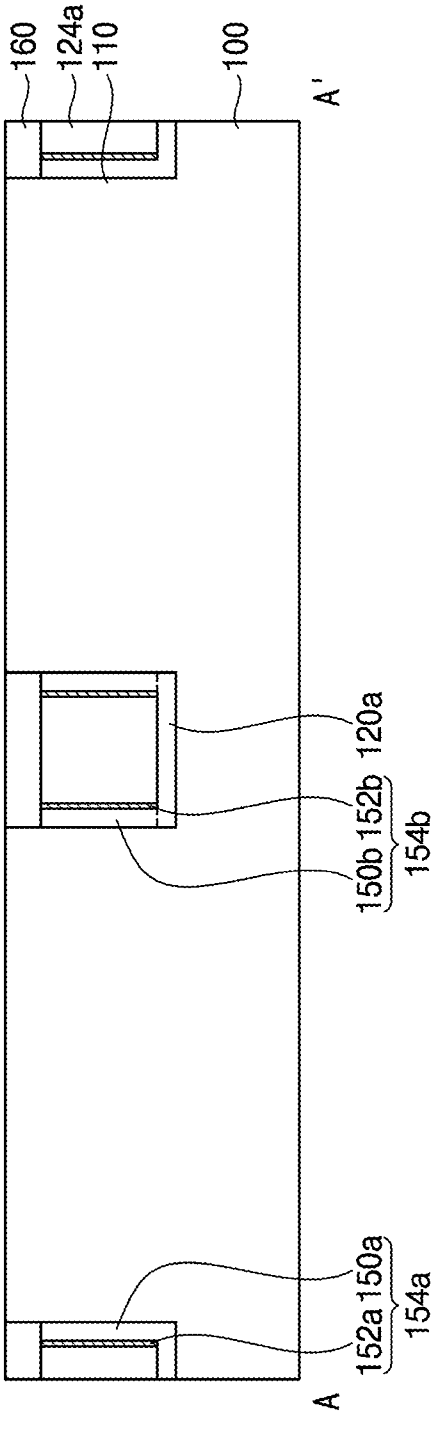
Figure 19:
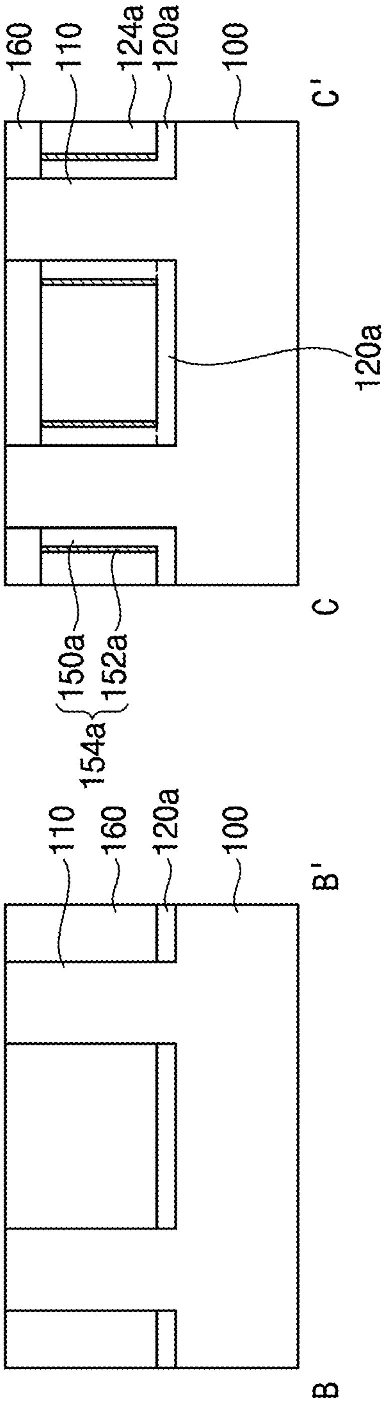

Referring to FIGS. 17 to 19, the first hard mask pattern 130 may be removed. A fifth insulation layer may be formed on the first liner structure 154*a*, the second liner structure 154*b*, the first active pattern 110, and the first and second insulation layer patterns 120*a* and 124*a* to fill the first opening 134. The fifth insulation layer may include, e.g., silicon oxide.

The fifth insulation layer may be planarized until the upper surface of the first active pattern 110 is exposed to form the fifth insulation layer pattern 160. Accordingly, the first liner structure 154*a*, the second liner structure 154*b*, the first and second insulation layer patterns 120*a* and 124*a*, and the fifth insulation layer pattern 160 may be formed in the isolation trench 102.

Figure 20:
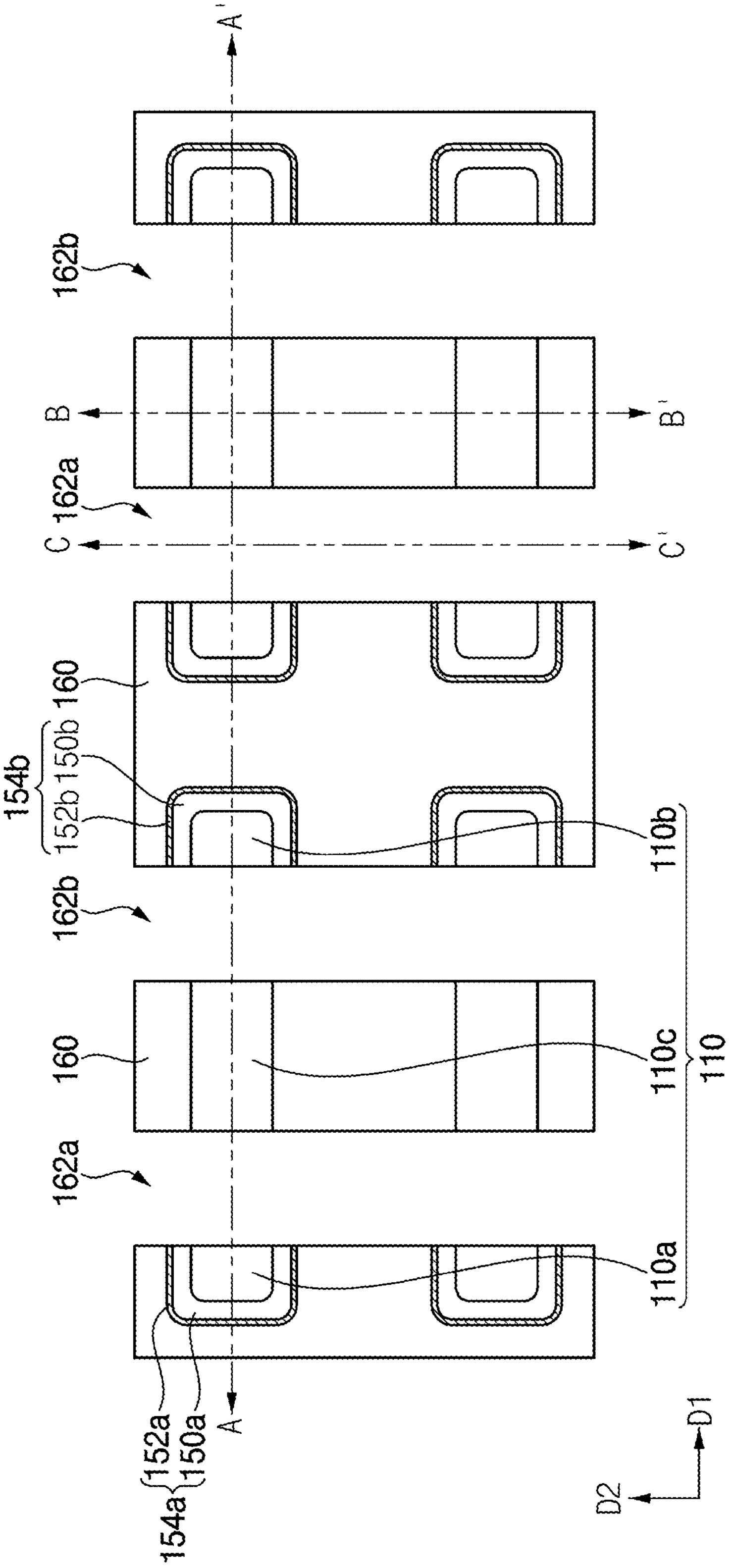
Figure 21:
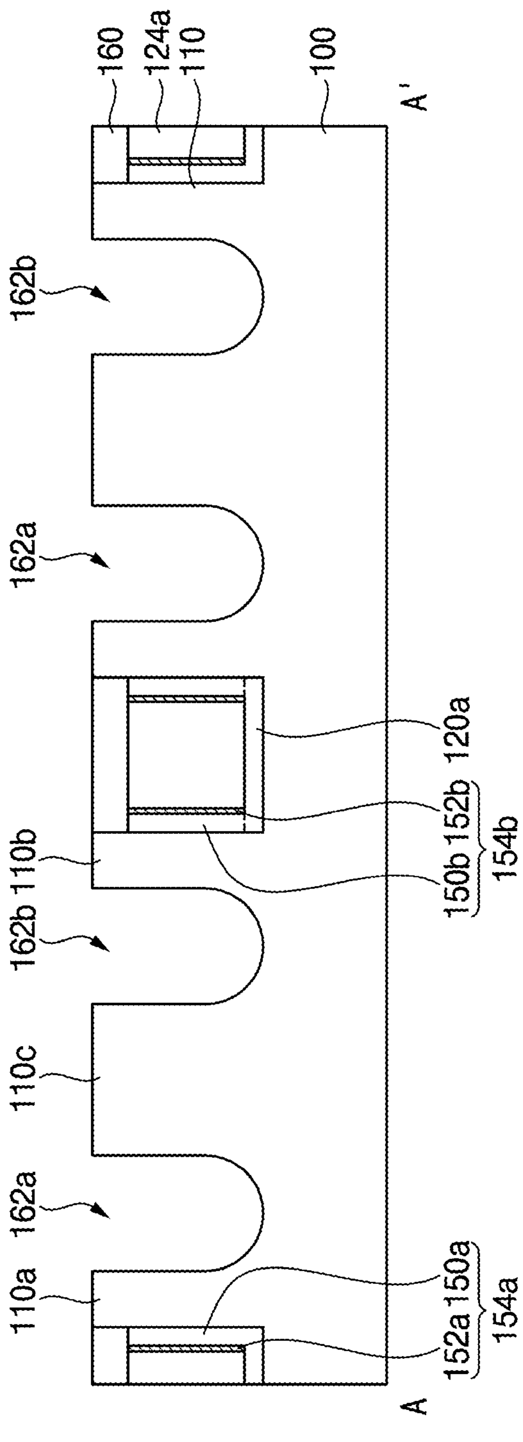
Figure 22:
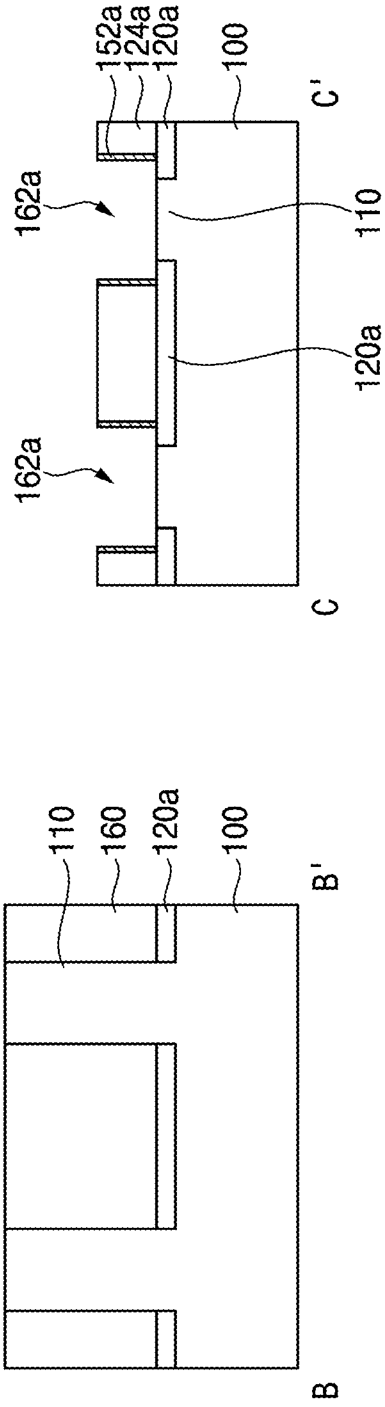

Referring to FIGS. 20 to 22, a second hard mask pattern may be formed on the first active pattern 110 and the fifth insulation layer pattern 160. The second hard mask pattern may include openings positioned at regions for forming the two gate structures on the first active pattern 110. The openings may extend in the second direction D2.

An exposed first active pattern 110 may be etched using the second hard mask pattern as an etch mask to form the first and second recesses 162*a* and 162*b*, respectively. In the etching process, the fifth insulation layer pattern 160 and the first and second liner structures 154*a* and 154*b* exposed by the opening may be removed together.

The first and second recesses 162*a* and 162*b* may be spaced apart from each other in the first direction D1, and extend in the second direction D2. An upper portion of the first active pattern 110 may be divided into a first portion 110*a*, a second portion 110*b*, and a third portion 110*c* by the first and second recesses 162*a* and 162*b*. The first portion 110*a* may be a portion corresponding to a left portion outside of the first recess 162*a*, the second portion 110*b* may be a portion corresponding to a right portion outside of the second recess 162*b*, and the third portion 110*c* may be a region between the first and second recesses 162*a* and 162*b*.

The first liner structure 154*a* may surround a sidewall of the first portion 110*a* of the first active pattern, and the second liner structure 154*b* may surround a sidewall of the second portion 110*b* of the first active pattern. However, a liner structure may not be formed on a sidewall of the third portion 110*c* of the first active pattern. Both ends of the first metal liner pattern 152*a* may be exposed on one sidewall of the first recess 162*a*, and both ends of the second metal liner pattern 152*b* may be exposed on one sidewall of the second recess 162*b*.

As shown in FIG. 22, the first and second insulation layer patterns 120*a* and 124*a* having some thickness may remain on bottoms of the first and second recesses 162*a* and 162*b* positioned between the first active patterns in the second direction D2. In example embodiments, portions of the first metal liner pattern 152*a* and the second metal liner pattern 152*b* may remain on the sidewall of the second insulation layer pattern 124*b*.

Figure 23:
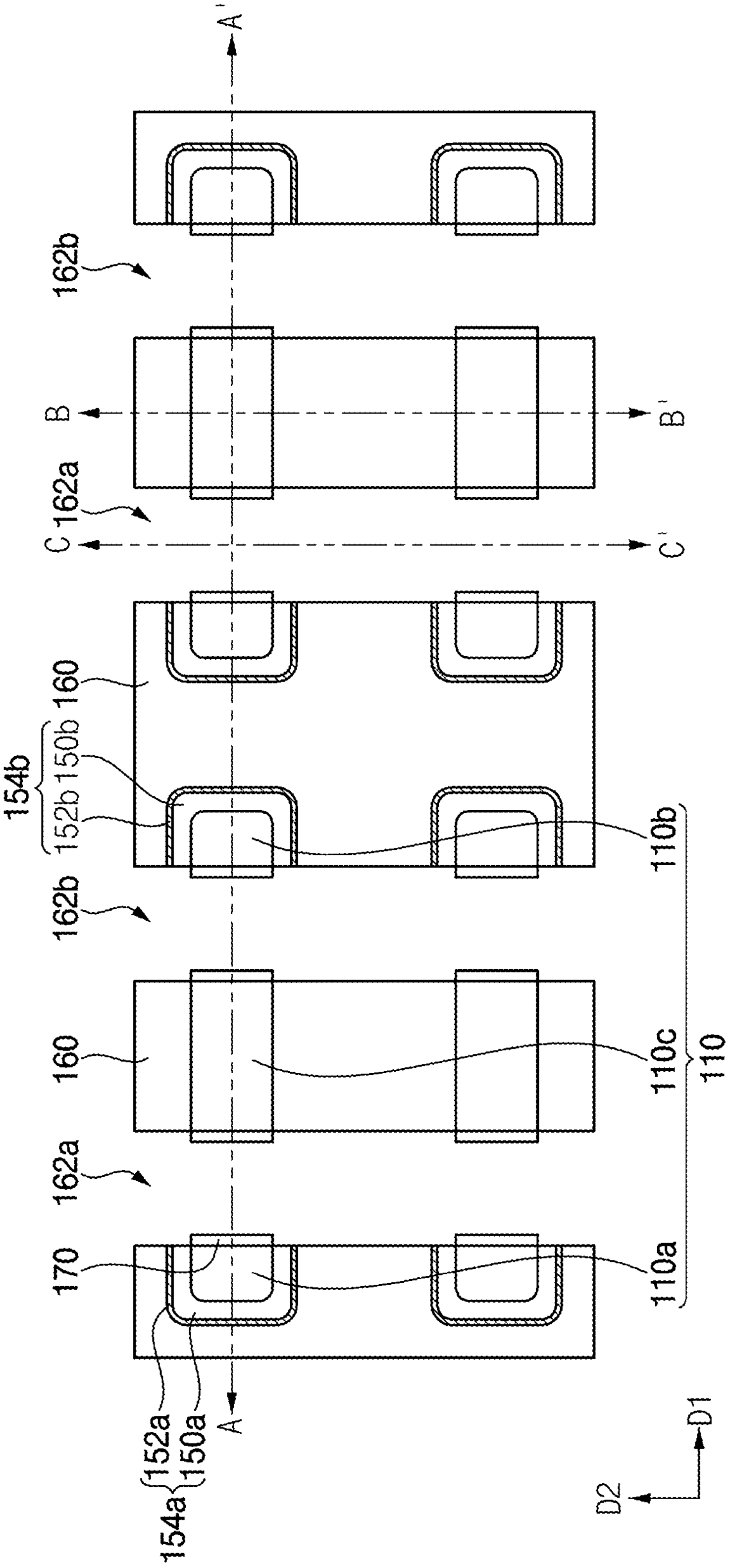
Figure 24:
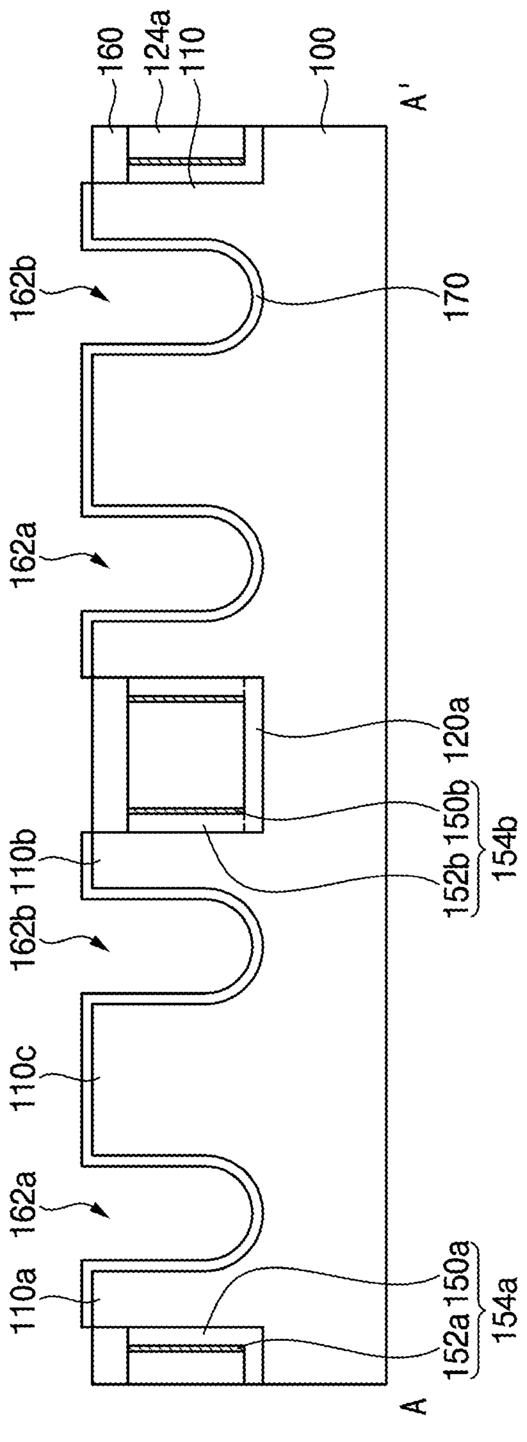
Figure 25:
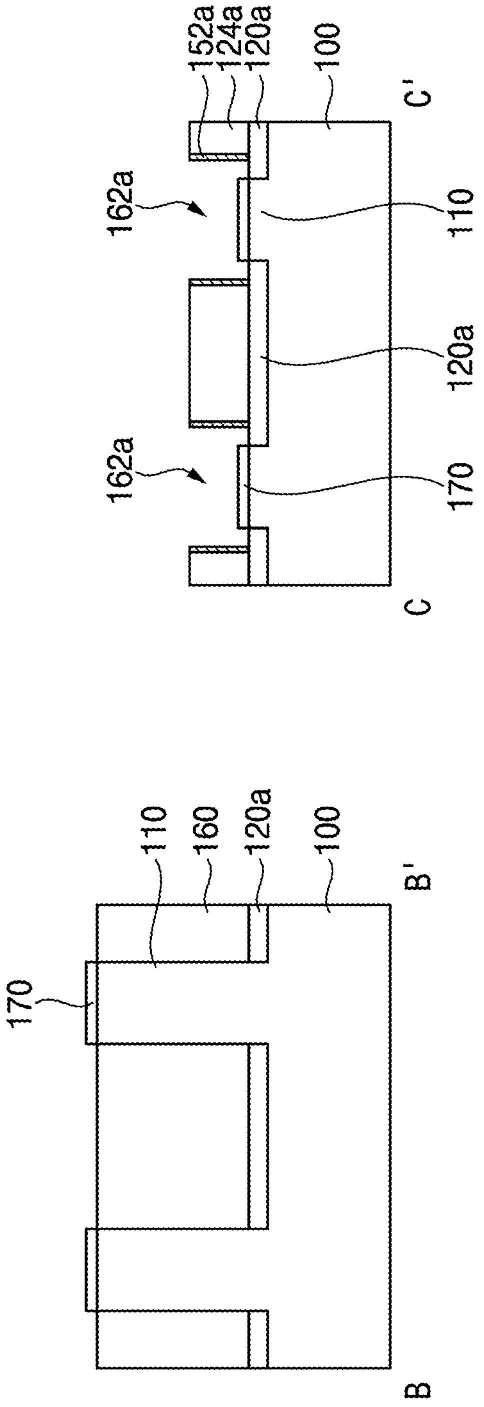

Referring to FIGS. 23 to 25, a gate oxide layer 170 may be formed on the first active pattern 110 by an oxidation process. The gate oxide layer 170 may include, e.g., silicon oxide. The oxidation process may include, e.g., thermal oxidation or radical oxidation.

When the oxidation process is performed, the gate oxide layer 170 may be formed on an inner surface of the first recess 162*a*, an inner surface of the second recess 162*b*, and the upper surface of the first active pattern 110. The gate oxide layer 170 may not be formed on the first and second liner structures 154*a* and 154*b* and the first insulation layer pattern 120*a* exposed by inner surfaces of the first and second recesses 162*a* and 162*b*. In addition, the gate oxide layer may not be formed on the fifth insulation layer pattern 160 between the first active patterns 110.

Figure 26:
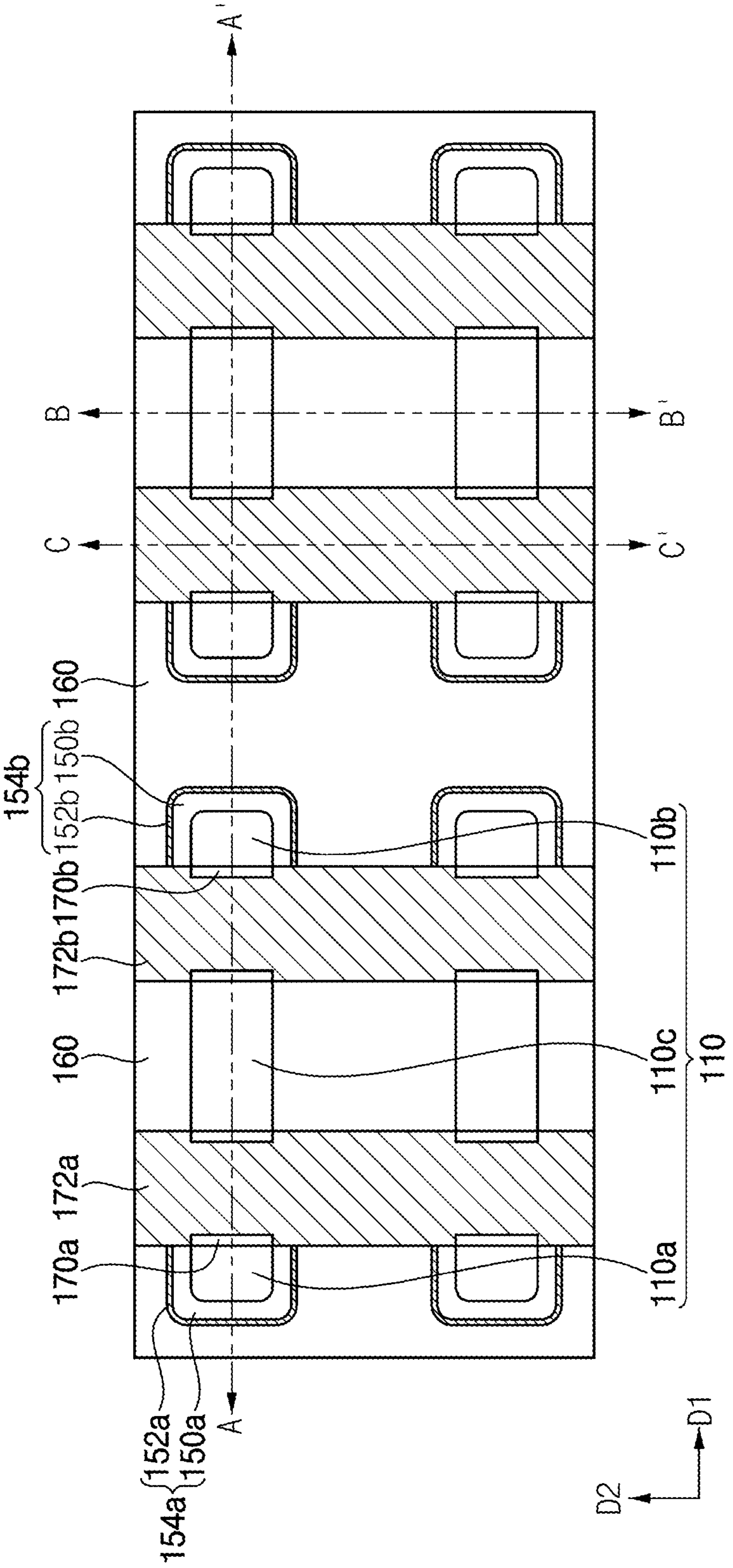
Figure 27:
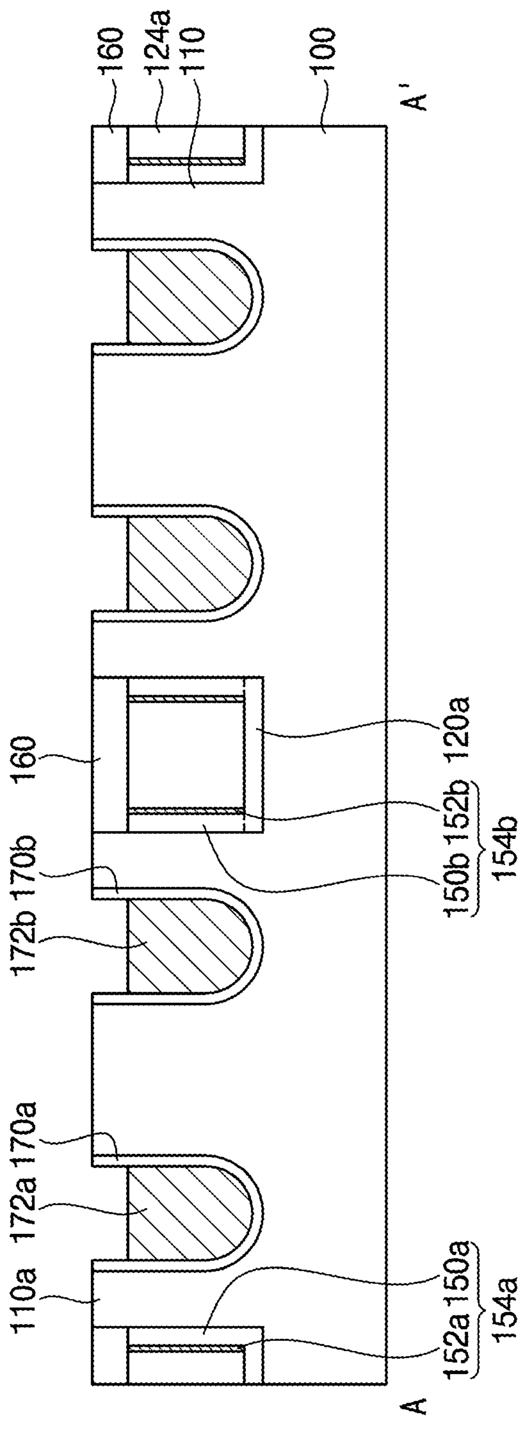
Figure 28:
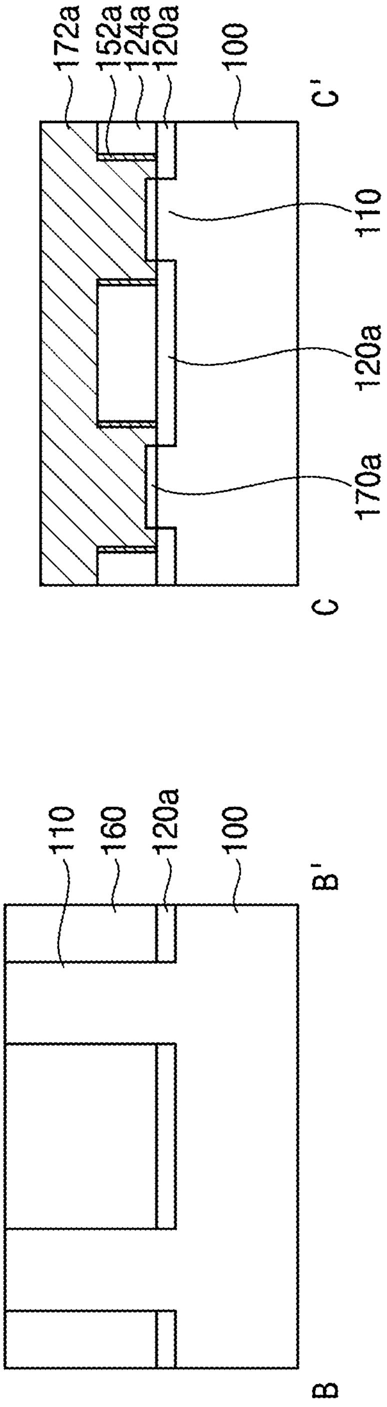

Referring to FIGS. 26 to 28, a gate conductive layer may be formed on the gate oxide layer 170, the first insulation layer pattern 120*a*, first and second liner structures 154*a* and 154*b* and the fifth insulation layer pattern 160 to fill the first and second recesses 162*a* and 162*b*. The gate conductive layer may include a metal, e.g., tungsten.

In example embodiments, the gate conductive layer may include a barrier metal layer and a metal layer. The barrier metal layer may include titanium, titanium nitride, tantalum, tantalum nitride, tungsten nitride, tungsten carbon nitride, or the like. The metal layer may include tungsten, aluminum, copper, or the like. For example, the metal layer may include tungsten.

In example embodiments, the gate conductive layer may include only a metal layer. In some example embodiments, the gate conductive layer may include polysilicon.

Thereafter, the gate conductive layer may be planarized until the upper surface of the first active pattern 110 is exposed. In the planarization process, the gate oxide layer formed on the upper surface of the first active pattern 110 may be removed. The planarization process may include, e.g., a chemical mechanical polishing (CMP) process and/or an etch-back process.

Thereafter, the gate conductive layer positioned at an upper portion of the first and second recesses 162*a* and 162*b* may be removed. Accordingly, the first gate oxide layer 170*a* and the first gate pattern 172*a* may be formed in the first recess 162*a*, and the second gate oxide layer 170*b* and the second gate pattern 172*b* may be formed in the second recess 162*b*.

In example embodiments, each of the first and second gate patterns 172*a* and 172*b* may include a barrier metal pattern and a metal pattern. In some example embodiments, each of the first and second gate patterns 172*a* and 172*b* may include a metal pattern. In some example embodiments, each of the first and second gate patterns 172*a* and 172*b* may include polysilicon.

As shown in FIG. 26, the first gate pattern 172*a* may directly contact the first metal liner pattern 152*a*. The first metal liner pattern 152*a* may be electrically connected to the first gate pattern 172*a*. Since the first gate oxide layer 170*a* is formed only on the surface of the first active pattern 110 in the first recess 162*a*, the first gate oxide layer 170*a* may not be formed between the first gate pattern 172*a* and the first metal liner pattern 152*a*.

The second gate pattern 172*b* may directly contact the second metal liner pattern 152*b*. The second metal liner pattern 152*b* may be electrically connected to the second gate pattern 172*b*. Since the second gate oxide layer 170*b* is formed only on the surface of the first active pattern 110 in the second recess 162*b*, the second gate oxide layer 170*b* may not be formed between the second gate pattern 172*b* and the second metal liner pattern 152*b*. The first gate pattern 172*a* and the second gate pattern 172*b* may not be electrically connected to each other by the first and second metal liner patterns 152*a* and 152*b*.

Figure 29:
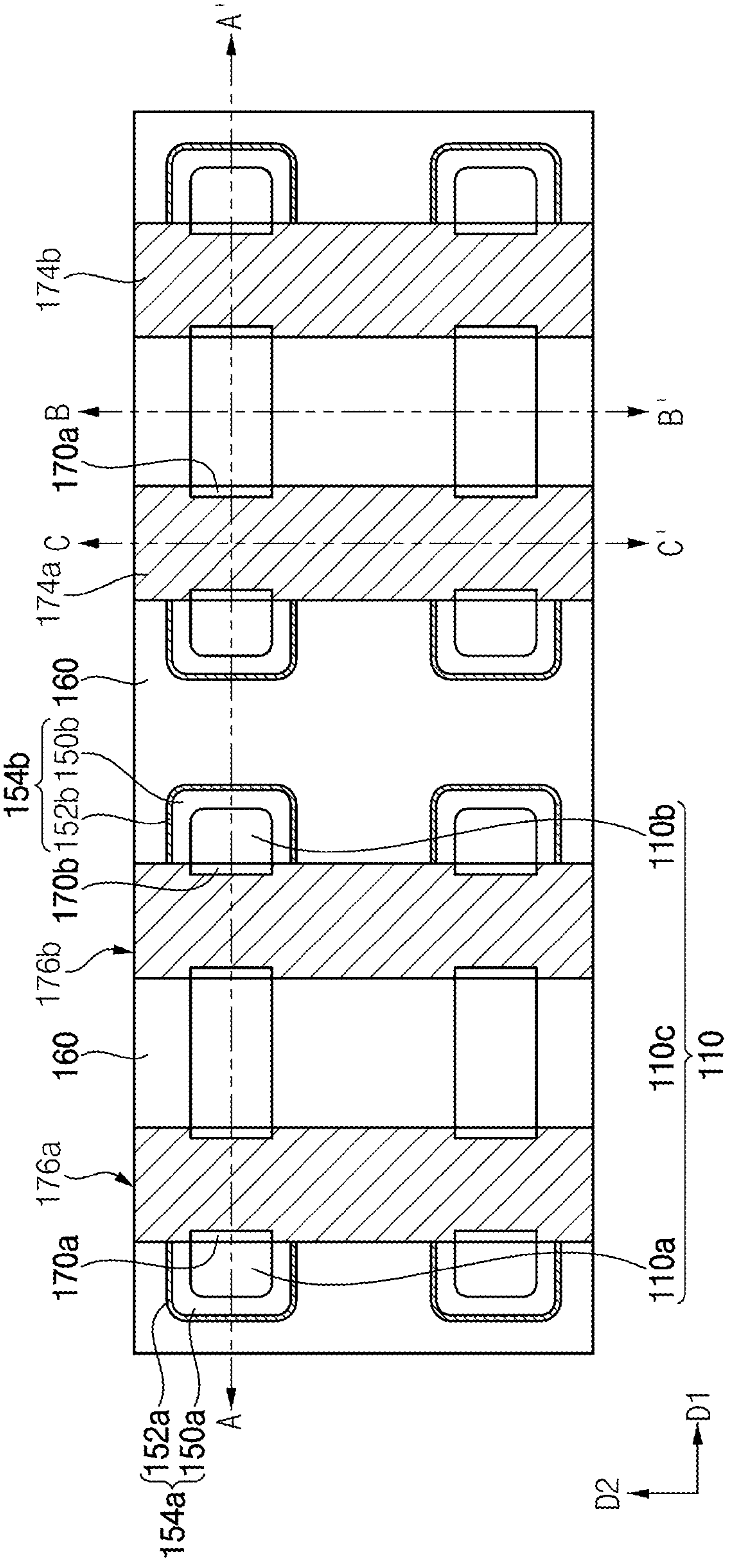
Figure 30:
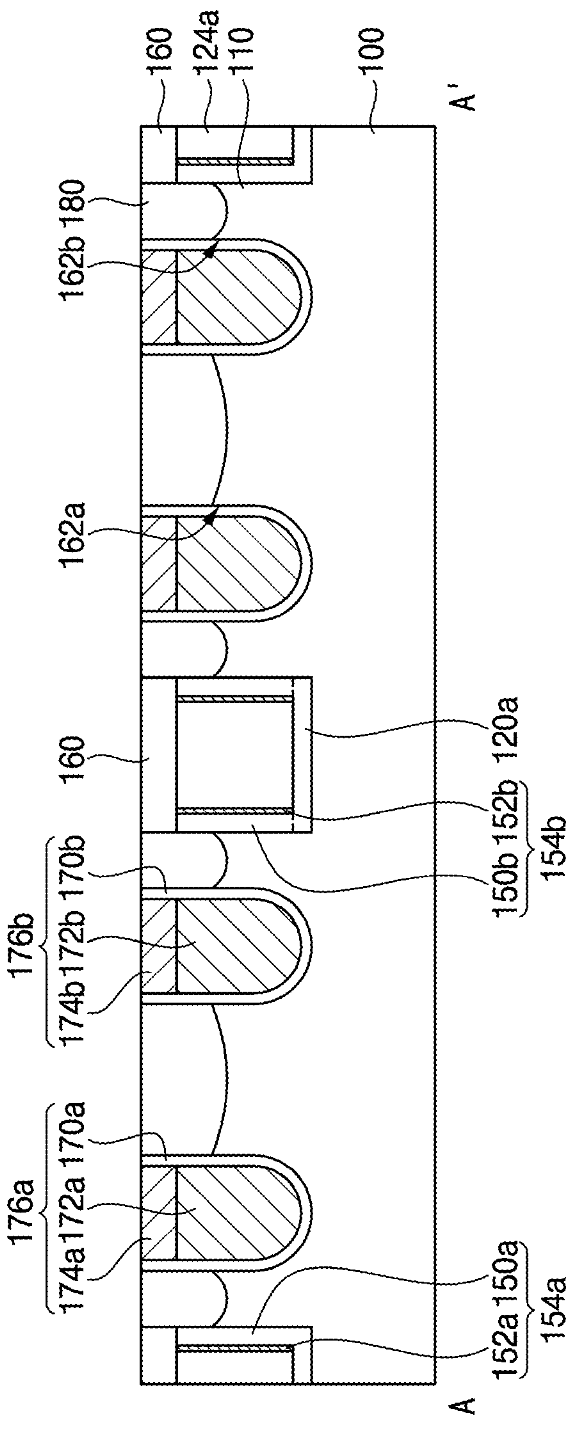
Figure 31:
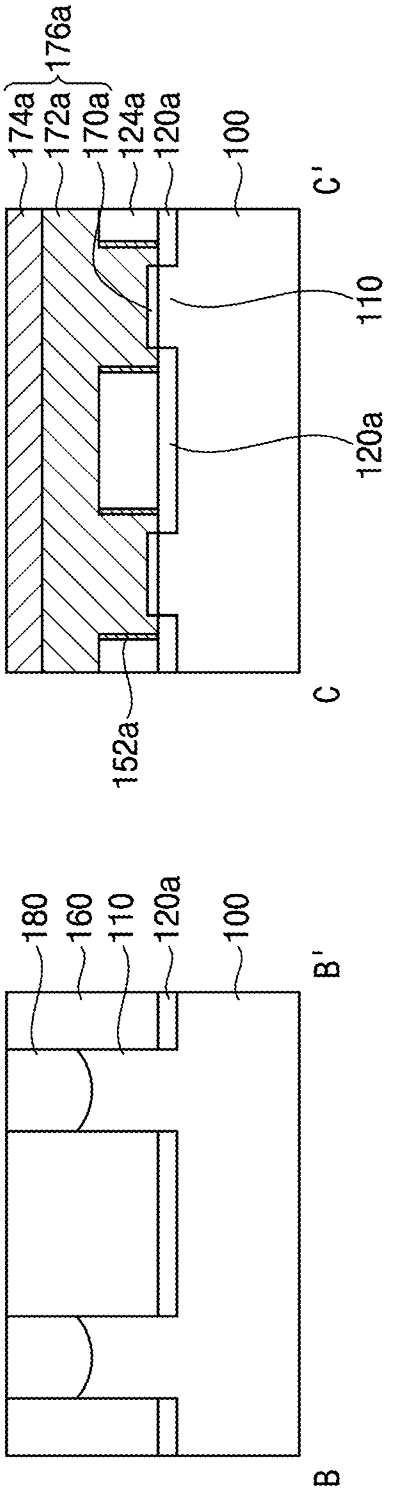

Referring to FIGS. 29 to 31, a capping layer may be formed on the first and second gate patterns 172*a* and 172*b*, the first active pattern 110, and the fifth insulation pattern to fill the first and second recesses 162*a* and 162*b*. The capping layer may include, e.g., silicon nitride.

The capping layer may be planarized until the upper surface of the first active pattern 110 is exposed. Accordingly, the first capping pattern 174*a* may be formed on the first gate pattern 172*a* in the first recess 162*a*, and the second capping pattern 174*b* may be formed on the second gate pattern 172*b* in the second recess 162*b*. The planarization process may include, e.g., a chemical mechanical polishing (CMP) process and/or an etch-back process.

By the above process, the first gate structure 176*a* in which the first gate oxide layer 170*a*, the first gate pattern 172*a*, and the first capping pattern 174*a* that are stacked may be formed in the first recess 162*a*. The second gate structure 176*b* in which the second gate oxide layer 170*b*, the second gate pattern 172*b*, and the second capping pattern 174*b* that are stacked may be formed in the second recess 162*b*.

After forming the first and second gate structures 176*a* and 176*b*, the impurity region 180 may be formed at an upper portion of the first active pattern 110. The impurity region 180 may be formed at regions adjacent to both sides of the first and second gate structures 176*a* and 176*b*. In some example embodiments, a process for forming the impurity region 180 may be performed before forming the first and second recesses 162*a* and 162*b* described with reference to FIGS. 20 to 22.

The first gate structure 176*a*, the first liner structure 154*a*, and the impurity region 180 adjacent to both sides of the first gate structure 176*a* serve as a first recessed channel transistor. The second gate structure 176*b*, the second liner structure 154*b*, and the impurity region 180 adjacent to both sides of the second gate structure 176*b* serve as a second recessed channel transistor. Accordingly, two recessed channel transistors may be formed on the first active pattern 110.

As the first and second recessed channel transistors include the first and second metal liner patterns 152*a* and 152*b*, respectively, a control operation characteristic of a gate in each of the first and second recessed channel transistors may be improved. In addition, the short channel effect of each of the first and second recessed channel transistors may be decreased.

Figure 32:
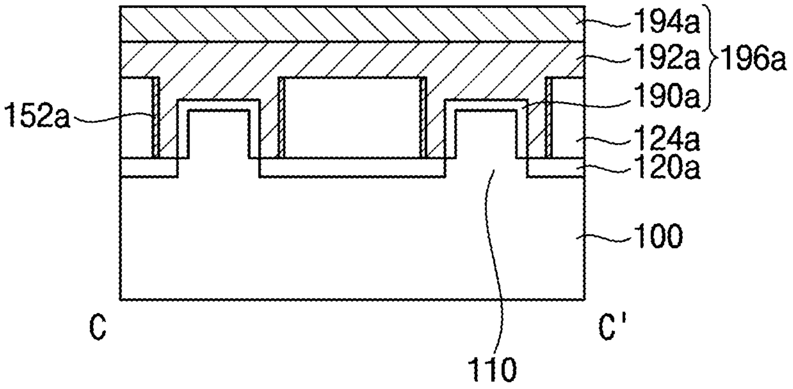
FIG. 32 is a cross-sectional view illustrating a semiconductor device according to example embodiments.

FIG. 32 is a cross-sectional view illustrating a semiconductor device according to example embodiments.

FIG. 32 is a cross-sectional view taken along line C-C' of FIG. 1. The semiconductor device in FIG. 32 is the same as the semiconductor device described with reference to FIGS. 1 to 4, except for shapes of the first and second gate structures. Cross-sectional views of the semiconductor device in FIG. 32 taken along line A-A' and line B-B' of FIG. 1 are the same as the cross-sectional views in FIGS. 2-3, respectively.

Referring to FIG. 32, the first and second recesses may be formed in regions of the substrate 100 where the first and second gate structures are to be formed.

The first active pattern 110 may be exposed by sidewalls and bottom of the first recess. In this case, an upper surface of the first active pattern 110 and both sidewalls in the second direction D2 of the first active pattern 110 connected thereto may be partially exposed by the bottom of the first recess.

Similarly, the first active pattern 110 may be exposed by sidewalls and bottom of the second recess. In this case, the upper surface of the first active pattern 110 and both sidewalls in the second direction D2 of the first active pattern 110 connected thereto may be partially exposed by the bottom of the second recess.

A first gate structure 196*a* may be formed in the first recess, and a second gate structure may be formed in the second recess. The first gate structure 196*a* may include a first gate oxide layer 190*a*, a first gate pattern 192*a*, and a first capping pattern 194*a*.

The first gate oxide layer 190*a* may be formed only on a surface of the first active pattern 110 exposed by the first recess. Particularly, in the bottom of the first recess, the first gate oxide layer 190*a* may be formed on the upper surface of the first active pattern 110 and both sidewalls in the second direction D2 of the first active pattern 110. As such, the first active pattern 110 exposed by the bottom of the first recess may have a fin structure, and the first gate structure 196*a* may be formed on the first active pattern 110. The second gate structure may have substantially the same structure as the first gate structure 196*a*.

Since the first and second gate structures may be formed on the first active pattern 110 having the fin structure, electrical characteristics of the semiconductor device may be improved.

A process for manufacturing the semiconductor device may be substantially the same as the method of manufacturing the semiconductor device described with reference to FIGS. 5 to 31. However, in the processes described with reference to FIGS. 20 to 22, the etching process may be performed to partially expose the upper surface of the first active pattern 110 and both sidewalls in the second direction of the first active pattern 110 in the bottom of each of the first and second recesses. Accordingly, a semiconductor device as shown in FIG. 32 may be manufactured.

Figure 33:
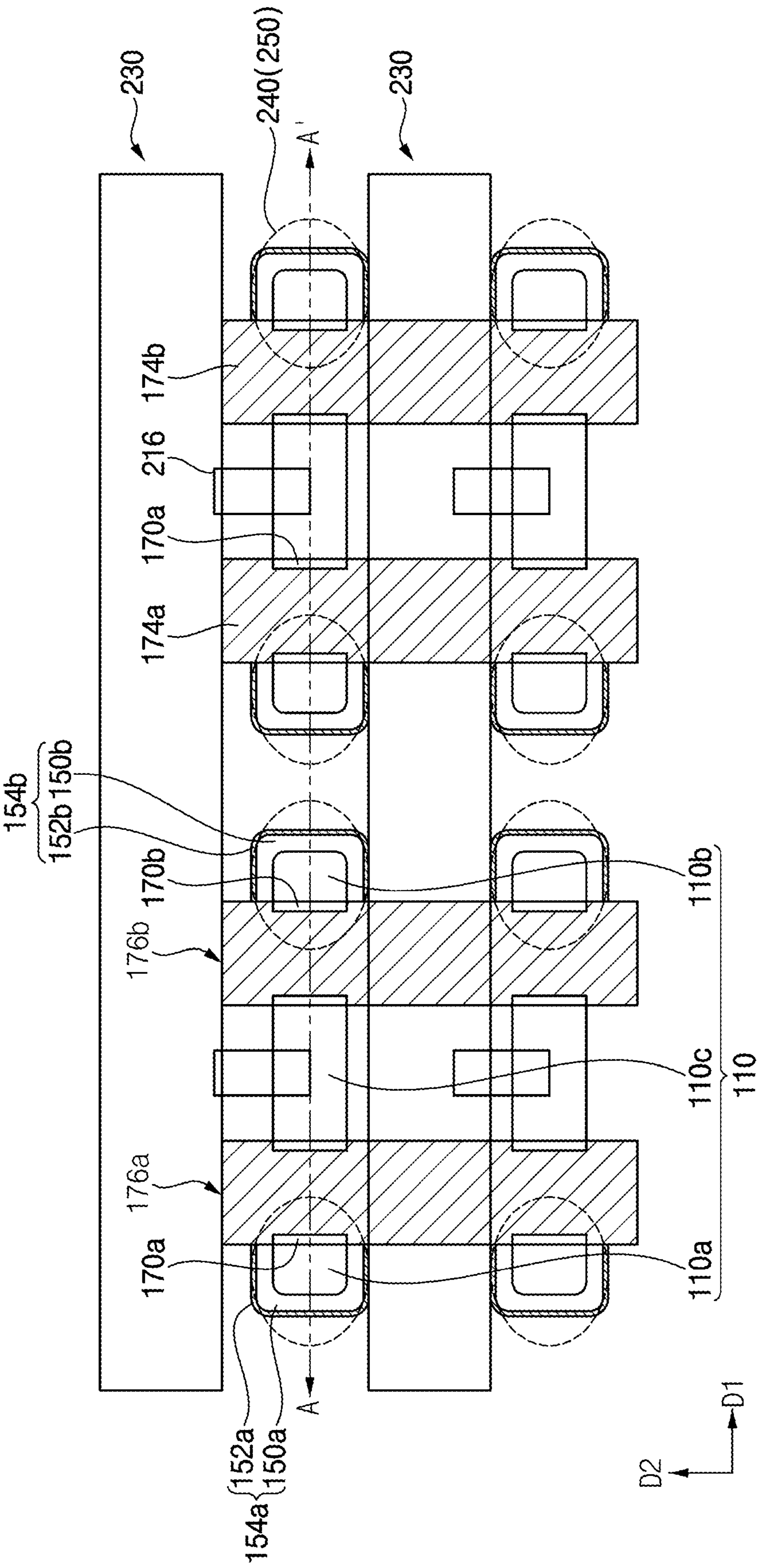
FIGS. 33 and 34 are a plan view and a cross-sectional view illustrating a semiconductor device according to example embodiments.
Figure 34:
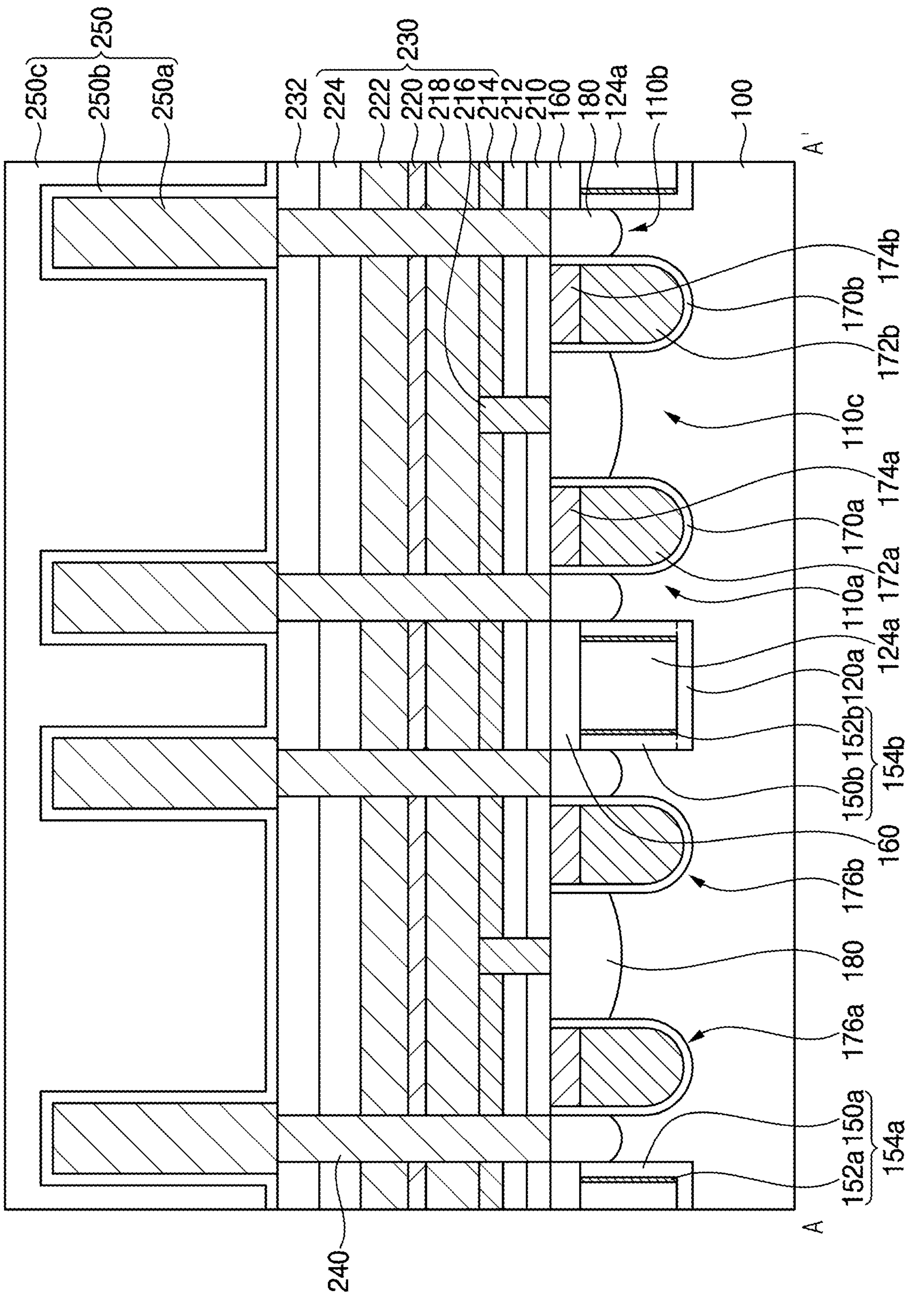

FIGS. 33 and 34 are a plan view and a cross-sectional view illustrating semiconductor devices according to example embodiments. FIG. 34 is a cross-sectional view taken along line A-A' of FIG. 33. Although the bit line structure may not be seen in FIG. 33, the bit line structure is illustrated in FIG. 34 for convenience of description.

The semiconductor device may be a DRAM device including recessed channel transistors. The recessed channel transistors may be the same as those described with reference to FIGS. 1 to 4. In some example embodiments, the recessed channel transistors may be the same as those described with reference to FIG. 32.

Referring to FIGS. 33 and 34, a first recessed channel transistor and a second recessed channel transistor may be formed on the first active pattern 110. The first recessed channel transistor may include the first gate structure 176*a*, the first liner structure 154*a*, and the impurity region 180 adjacent to both sides of the first gate structure 176*a*. The second recessed channel transistor may include the second gate structure 176*b*, the second liner structure 154*b*, and the impurity region 180 adjacent to both sides of the second gate structure 176*b*.

A pad insulation pattern 210, a first etch stop pattern 212, and a first conductive pattern 214 may be formed on the first active pattern 110, the first and second gate structures 176*a* and 176*b*, and the fifth insulation layer pattern 160. The pad insulation pattern 210 may include an oxide, e.g., silicon oxide, and the first etch stop pattern 212 may include a nitride, e.g., silicon nitride. The first conductive pattern 214 may include, e.g., polysilicon doped with impurities.

A third recess may be formed between stack structures including the pad insulation pattern 210, the first etch stop pattern 212, and the first conductive pattern 214 stacked. An upper portion of the third portion 110*c* of the first active pattern between the first and second gate structures 176*a* and 176*b* may be exposed by the third recess.

A second conductive pattern 216 may be formed in the third recess. The second conductive pattern 216 may include, e.g., polysilicon doped with impurities. The second conductive pattern 216 may contact the impurity region 180 in the third portion 110*c* of the first active pattern.

A third conductive pattern 218 may be stacked on the first conductive pattern 214 and the second conductive pattern 216. The third conductive pattern 218 may include, e.g., polysilicon doped with impurities. Since the first to third conductive patterns 214, 216 and 218 include substantially the same material, the first to third conductive patterns 214, 216, and 218 may be merged into one lower conductive pattern. A barrier metal pattern 220, a metal pattern 222, and a hard mask pattern 224 may be stacked on the third conductive pattern 218.

A stacked structure of the first to third conductive patterns 214, 216 and 218, the barrier metal pattern 220, the metal pattern 222, and the hard mask pattern 224 may serve as the bit line structure 230. For example, the second conductive pattern 216 may serve as a bit line contact, and the first conductive pattern 214, the third conductive pattern 218, the barrier metal pattern 220, and the metal pattern 222 may serve as a bit line. The bit line structure 230 may be electrically connected to the impurity region 180 in the third portion 110*c* of the first active pattern.

The bit line structure 230 may extend, e.g., lengthwise, in the first direction D1. A plurality of the bit line structures 230 may be arranged, e.g., spaced apart from each other, in the second direction D2. An extension direction of the bit line structure 230 may be the same as the length direction of the first active pattern 110. In example embodiments, an insulation spacer may be formed on sidewalls of the bit line structure 230.

A first insulating interlayer may fill a space between the bit line structures 230. In addition, a second insulating interlayer 232 may be formed on the bit line structures 230 and the first insulating interlayer. The first and second insulating interlayers may include, e.g., silicon oxide.

A contact plug 240 may pass through the second insulating interlayer 232, the first insulating interlayer, the first etch stop pattern 212, and the pad insulation pattern 210, and the contact plug 240 may contact each of the first and second portions 110*a* and 110*b* of the first active pattern. The contact plugs 240 may be electrically connected to the impurity regions 180 in the first and second portions 110*a* and 110*b* of the first active pattern, respectively. The contact plugs 240 may be electrically insulated from the bit line structure 230.

In example embodiments, the contact plug 240 may be disposed between the bit line structures 230. In example embodiments, the insulation spacer may be formed between the contact plug 240 and the bit line structure 230.

A capacitor 250 may be formed on each of the contact plugs 240. The capacitor 250 may have a structure in which a lower electrode 250*a*, a dielectric layer 250*b*, and an upper electrode 250*c* are stacked. The lower electrode of the capacitor 250 may have a cylindrical shape or a pillar shape.

In example embodiments, a landing pad may be further formed between the contact plug 240 and the lower electrode 250*a*. In example embodiments, a second etch stop layer may be further formed on the second insulating interlayer 232. The lower electrode 250*a* of the capacitor 250 may pass through the second etch stop layer, and may contact the contact plug 240.

Figure 35:
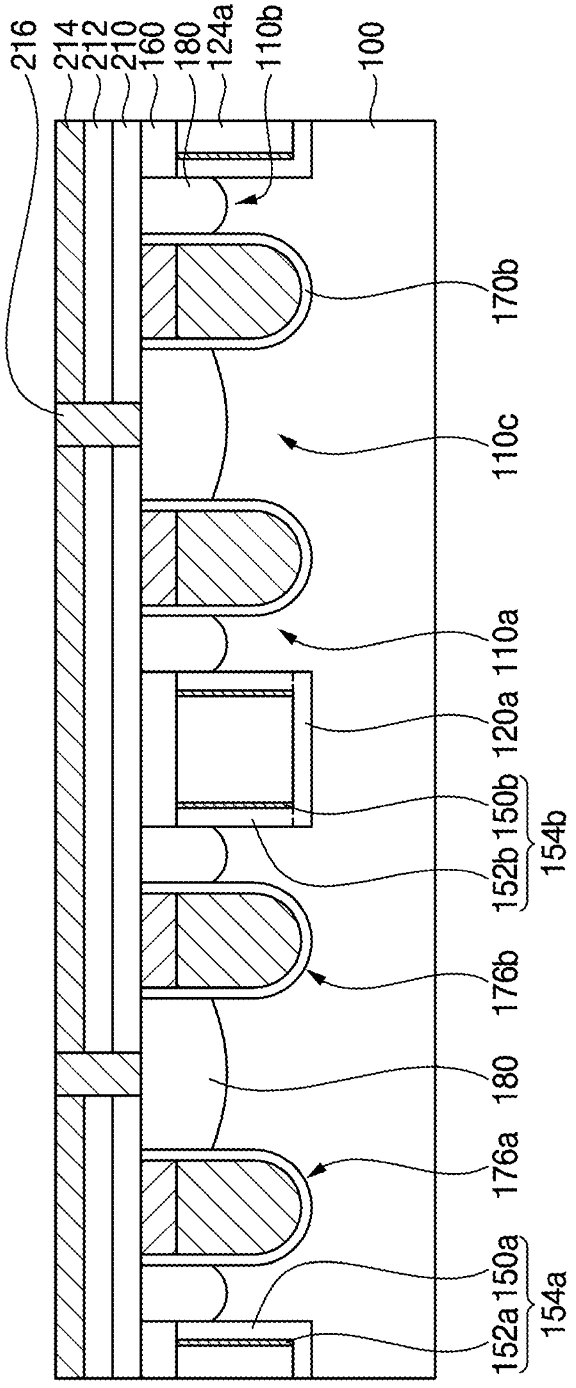
FIGS. 35 to 39 are plan views and cross-sectional views illustrating stages in a method of manufacturing a semiconductor device according to example embodiments.
Figure 36:
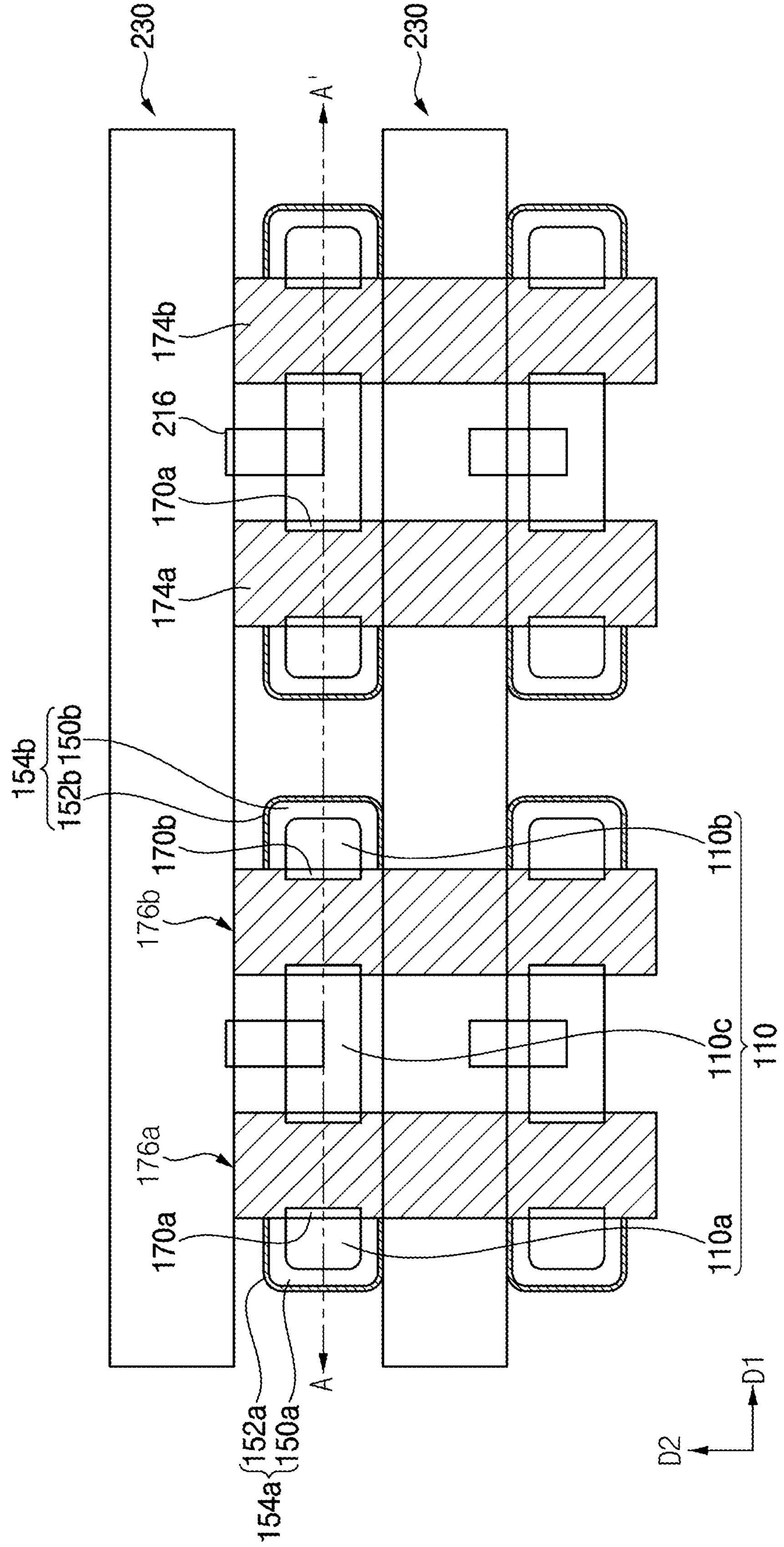
Figure 37:
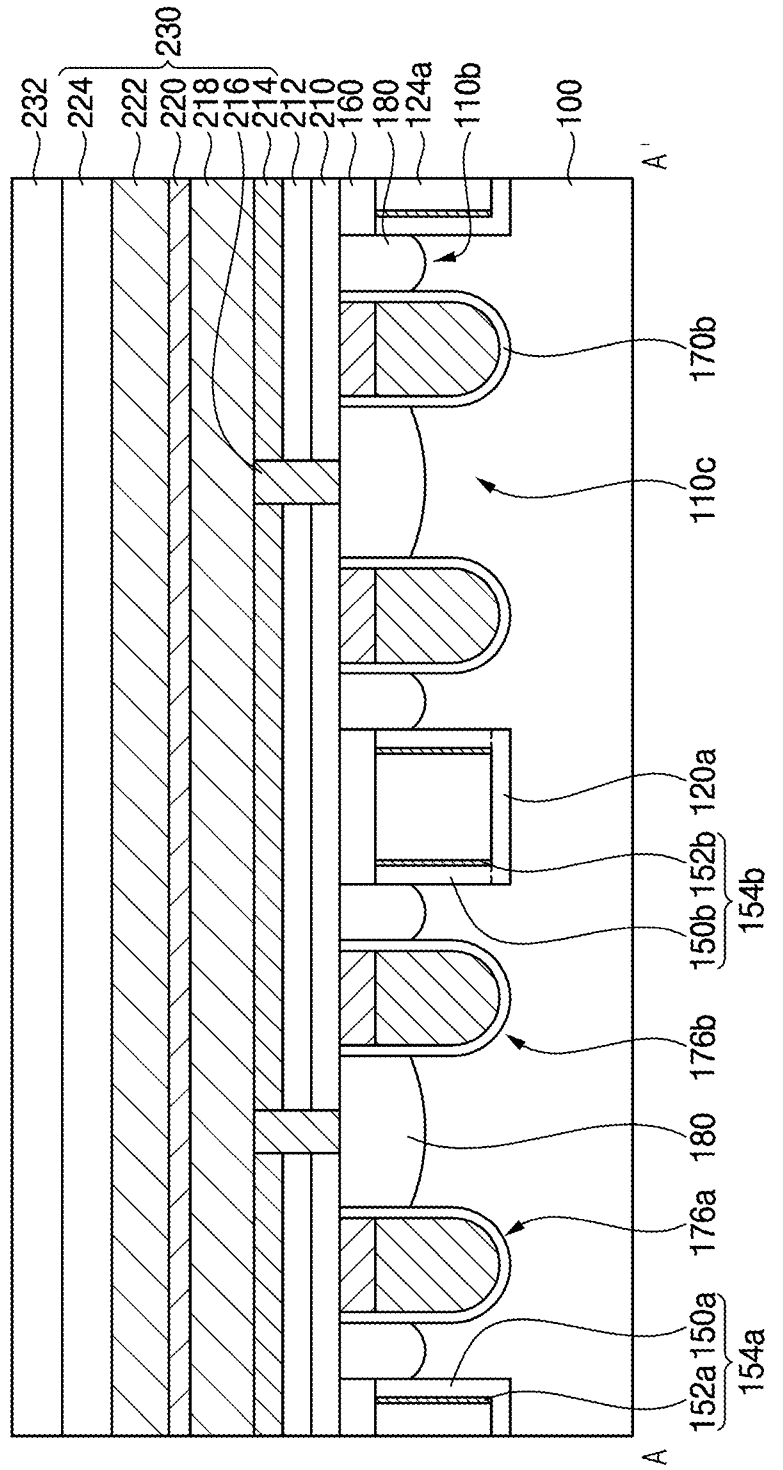
Figure 38:
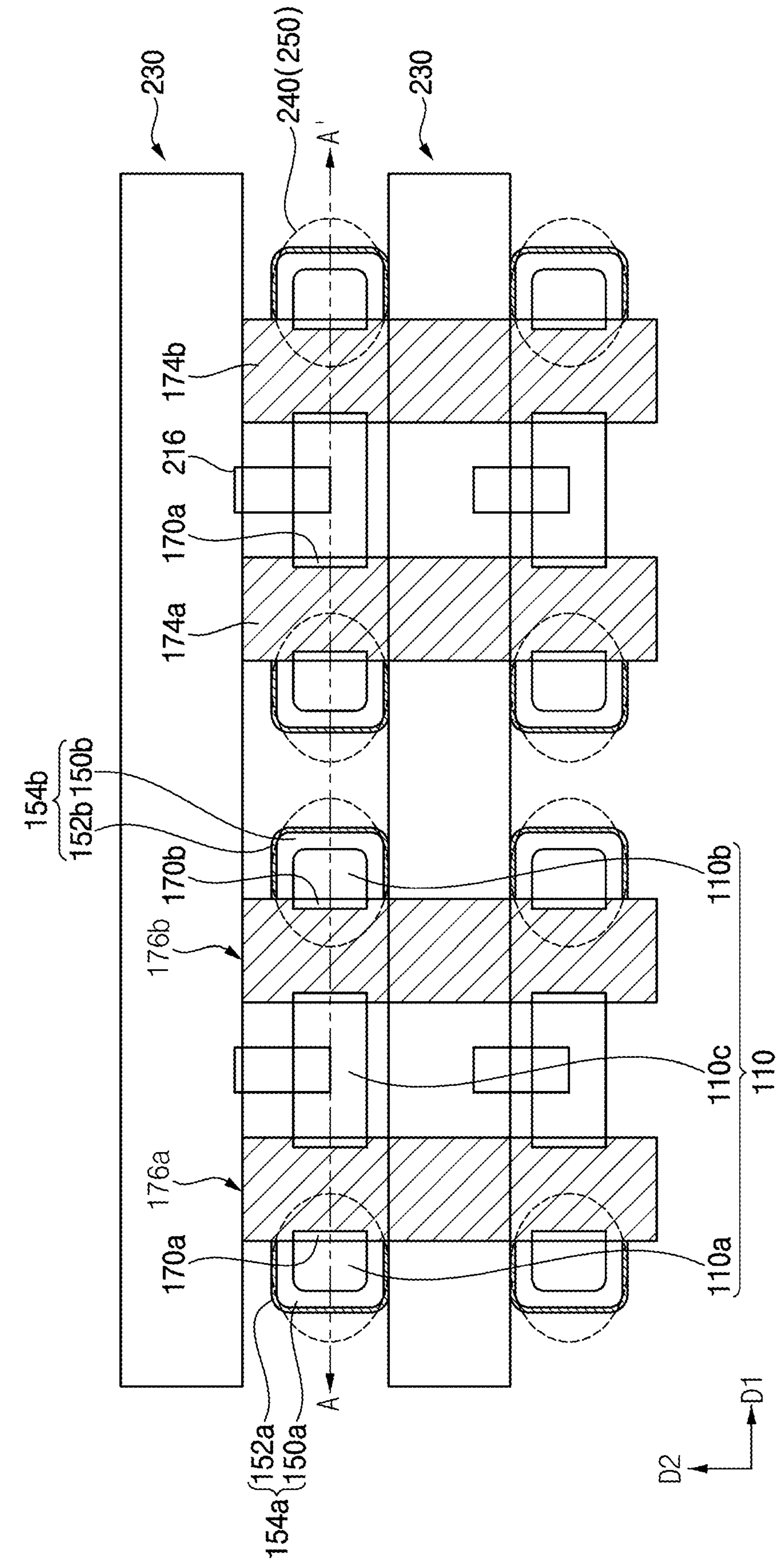
Figure 39:
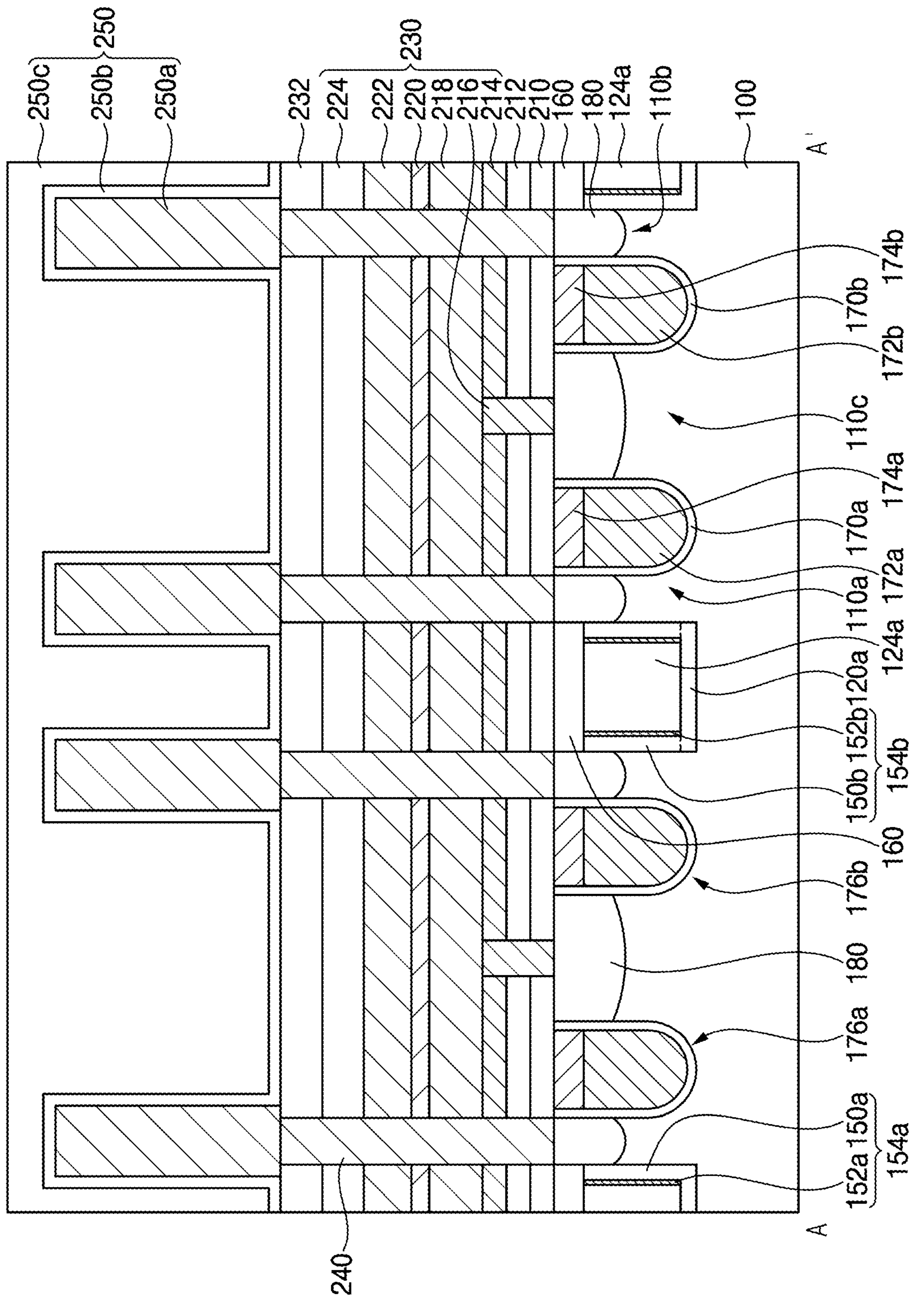

FIGS. 35 to 39 are plan views and cross-sectional views illustrating stages in a method of manufacturing a semiconductor device according to example embodiments. FIGS. 35 and 38 are plan views, and FIGS. 36, 37 and 39 are cross-sectional views. Each of the cross sectional views is a cut along line A-A' of a corresponding view. Although the bit line structure is not seen in the cross-sectional view, the bit line structure is illustrated in each of FIGS. 36, 37 and 39 for convenience of description.

Referring to FIG. 35, the first recessed channel transistor and the second recessed channel transistor may be formed on the first active pattern 110 by performing the same processes as described with reference to FIGS. 5 to 31.

A pad insulation layer, a first etch stop layer, and a first conductive layer may be formed on the first active pattern 110, the first and second gate structures 176*a* and 176*b*, and the fifth insulation layer pattern 160. The pad insulation layer, the first etch stop layer, and the first conductive layer may be patterned to form the pad insulation pattern 210, the first etch stop pattern 212, and the first conductive pattern 214. A third recess may be formed between the stack structures including the stacked pad insulation pattern 210, the first etch stop pattern 212, and the first conductive pattern 214. The third portion 110*c* of the first active pattern between the first and second gate structures 176*a* and 176*b* may be exposed by the third recess. The second conductive pattern 216 may be formed in the third recess.

Referring to FIGS. 36 and 37, a third conductive layer, a barrier metal layer, and a metal layer are formed on the first conductive pattern 214 and the second conductive pattern 216. A hard mask pattern 224 may be formed on the metal layer. The third conductive pattern 218, the barrier metal pattern 220, and the metal pattern 222 may be etched using the hard mask pattern 224 as an etch mask to form the third conductive pattern 218, the barrier metal pattern 220, the metal pattern 222, and the hard mask pattern 224.

A stacked structure including the first to third conductive patterns 214, 216 and 218, the barrier metal pattern 220, the metal pattern 222, and the hard mask pattern 224 stacked may serve as the bit line structure 230. In example embodiments, spacers may be formed on sidewalls of the bit line structure 230.

After that, a first insulating interlayer may be formed to fill the space between the bit line structures 230. The first insulating interlayer may include, e.g., silicon oxide.

Referring to FIGS. 38 and 39, the second insulating interlayer 232 may be formed on the first insulating interlayer and the bit line structures 230. The contact plug 240 may be formed through the second insulating interlayer 232, the first insulating interlayer, the first etch stop pattern 212, and the pad insulation pattern 210. The contact plugs 240 may contact the impurity regions 180 in the first and second portions 110*a* and 110*b* of the first active pattern, respectively.

The capacitor 250 may be formed on each of the contact plugs 240. The capacitor 250 may include the lower electrode 250*a*, the dielectric layer 250*b*, and the upper electrode 250*c*.

By the above process, a DRAM device may be manufactured.

By way of summation and review, as the DRAM device is highly integrated, forming a transistor having excellent electrical characteristics may be difficult. Therefore, example embodiments provide a semiconductor device with an improved transistor structure having excellent characteristics.

That is, in the semiconductor device according to example embodiments, recessed channel transistors formed on the first active pattern may include first and second metal liner patterns, so that the recessed channel transistors may have a structure similar to a gate all-around (GAA) structure. Accordingly, a capacitance at the gate oxide layer may be increased, and a short channel effect of the recessed channel transistors may be decreased. Also, in the recessed channel transistors, a control operation characteristic of a gate may be improved, and thus, an on-off characteristic may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

a first active pattern protruding from the substrate, the first active pattern having an isolated shape, and a longitudinal direction of the first active pattern extending in a first direction parallel to an upper surface of the substrate;

a first recess and a second recess on the first active pattern and crossing the first active pattern, each of the first recess and the second recess extending in a second direction parallel to the upper surface of the substrate and perpendicular to the first direction, and the first recess and the second recess being spaced apart from each other in the first direction;

a first gate structure in the first recess, the first gate structure including a first gate oxide layer, a first gate pattern, and a first capping pattern;

a second gate structure in the second recess, the second gate structure including a second gate oxide layer, a second gate pattern, and a second capping pattern;

a first metal liner pattern surrounding a first portion of a sidewall of the first active pattern, exposing a bottom surface of the first recess, and being spaced apart from the sidewall of the first active pattern, a first end of the first metal liner pattern and a second end of the first metal liner pattern directly contacting a sidewall of the first gate pattern; and a second metal liner pattern surrounding a second portion of the sidewall of the first active pattern, exposing a bottom surface of the second recess and being spaced apart from the sidewall of the first active pattern, a first end of the second metal liner pattern and a second end of the second metal liner pattern directly contacting a sidewall of the second gate pattern.

2. The semiconductor device as claimed in claim 1, wherein the first gate oxide layer is only on a surface of the first active pattern in the first recess, and the second gate oxide layer is only on a surface of the first active pattern in the second recess.

3. The semiconductor device as claimed in claim 1, wherein each of the first gate oxide layer and the second gate oxide layer include silicon oxide.

4. The semiconductor device as claimed in claim 1, wherein:

the first metal liner pattern surrounds the first portion of the sidewall of the first active pattern outside of the first recess, a first insulation layer pattern being interposed between the first metal liner pattern and the sidewall of the first portion of the first active pattern, and the second metal liner pattern surrounds the second portion of the sidewall of the first active pattern outside of the second recess, a second insulation layer pattern being interposed between the second metal liner pattern and the sidewall of the second portion of the first active pattern.

5. The semiconductor device as claimed in claim 4, wherein a thickness of each of the first insulation layer pattern and the second insulation layer pattern is greater than a thickness of each of the first metal liner pattern and the second metal liner pattern.

6. The semiconductor device as claimed in claim 1, wherein each of the first metal liner pattern and the second metal liner pattern has a thickness of about 10 angstroms to about 100 angstroms.

7. The semiconductor device as claimed in claim 1, wherein each of the first metal liner pattern and the second metal liner pattern includes titanium, titanium nitride, tantalum, tantalum nitride, tungsten, tungsten nitride, or tungsten carbonitride.

8. The semiconductor device as claimed in claim 1, wherein uppermost portions of the first metal liner pattern and the second metal liner pattern are lower than upper surfaces of the first gate structure and the second gate structure.

9. The semiconductor device as claimed in claim 1, wherein the first gate pattern and the second gate pattern are electrically isolated from each other.

10. The semiconductor device as claimed in claim 1, wherein:

a plurality of first active patterns is arranged in the second direction and includes the first active pattern, the plurality of first active patterns being spaced apart from each other in the second direction, and each of the first gate structure and the second gate structure extends in the second direction to cross the plurality of first active patterns.

11. The semiconductor device as claimed in claim 1, wherein:

a plurality of first active patterns is arranged in the first direction and includes the first active pattern, and the first recess, the second recess, the first gate structure, the second gate structure, the first metal liner pattern, and the second metal liner pattern are on each of the plurality of first active patterns.

12. The semiconductor device as claimed in claim 1, further comprising impurity regions on an upper portion of the first active pattern adjacent to opposite sides of each of the first gate structure and the second gate structure.

13. The semiconductor device as claimed in claim 1, further comprising:

a bit line structure electrically connected to an upper portion of the first active pattern between the first recess and the second recess; and capacitors electrically connected to an upper portion of the first active pattern outside the first recess and an upper portion of the first active pattern outside the second recess, respectively.

* * * * *